US012183789B2

(12) United States Patent
Ozaki et al.

(10) Patent No.: US 12,183,789 B2
(45) Date of Patent: Dec. 31, 2024

(54) SEMICONDUCTOR DEVICE

(71) Applicant: FUJI ELECTRIC CO., LTD., Kawasaki (JP)

(72) Inventors: Daisuke Ozaki, Okaya (JP); Tohru Shirakawa, Matsumoto (JP); Yasunori Agata, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 447 days.

(21) Appl. No.: 17/645,996

(22) Filed: Dec. 26, 2021

(65) Prior Publication Data

US 2022/0123108 A1 Apr. 21, 2022

Related U.S. Application Data

(63) Continuation of application No. PCT/JP2020/044531, filed on Nov. 30, 2020.

(30) Foreign Application Priority Data

Jan. 17, 2020 (JP) .................................. 2020-006110

(51) Int. Cl.
*H01L 29/06* (2006.01)
*H01L 29/08* (2006.01)
*H01L 29/10* (2006.01)

(52) U.S. Cl.
CPC ...... *H01L 29/0696* (2013.01); *H01L 29/0804* (2013.01); *H01L 29/1033* (2013.01); *H01L 29/1095* (2013.01)

(58) Field of Classification Search
CPC ............. H01L 29/0696; H01L 29/0804; H01L 29/1033; H01L 29/1095; H01L 29/407;
(Continued)

(56) References Cited

U.S. PATENT DOCUMENTS 5,477,077 A * 12/1995 Kumagai ............ H01L 29/7395
257/E29.198
2017/0162560 A1 6/2017 Takahashi
(Continued)

FOREIGN PATENT DOCUMENTS

JP 2012156564 A 8/2012
JP 2012182391 A 9/2012
(Continued)

OTHER PUBLICATIONS

International Search Report and (ISA/237) Written Opinion of the International Search Authority for International Patent Application No. PCT/JP2020/044531, mailed by the Japan Patent Office on Mar. 2, 2021.

*Primary Examiner* — Victor A Mandala

(57) ABSTRACT

Provided is a semiconductor device which includes a semiconductor substrate including a transistor portion and a diode portion. The transistor portion includes an injection suppression region that suppresses injection of a carrier of a second conductivity type at an end portion on the diode portion side in a top view of the semiconductor substrate. The diode portion includes a lifetime control region including a lifetime killer. Both the transistor portion and the diode portion include a base region of a second conductivity type on a surface of the semiconductor substrate, the transistor portion further includes an emitter region of a first conductivity type and an extraction region of a second conductivity type having a higher doping concentration than the base region on the surface of the semiconductor substrate, and the injection suppression region is not provided with the emitter region and the extraction region.

18 Claims, 14 Drawing Sheets

(58) Field of Classification Search
CPC .............. H01L 29/7397; H01L 21/322; H01L 21/8234; H01L 27/06; H01L 29/083; H01L 29/32; H01L 29/66477; H01L 29/739; H01L 29/78; H01L 29/8613; H01L 27/0727; H01L 29/0619; H01L 29/0684

See application file for complete search history.

(56) References Cited

U.S. PATENT DOCUMENTS

| | | |
|---|---|---|
| 2017/0222029 A1 | 8/2017 | Kono |
| 2017/0236908 A1* | 8/2017 | Naito ................. H01L 29/32 257/48 |
| 2017/0352730 A1* | 12/2017 | Nakamura ............ H01L 21/266 |
| 2019/0096989 A1 | 3/2019 | Yoshida |
| 2019/0287961 A1 | 9/2019 | Naito |
| 2020/0035817 A1 | 1/2020 | Tamura |
| 2020/0091329 A1* | 3/2020 | Mitsuzuka ............ H01L 29/417 |
| 2020/0105745 A1* | 4/2020 | Obata .................. H01L 29/861 |
| 2020/0135593 A1* | 4/2020 | Takishita ............ H01L 29/6609 |
| 2020/0335496 A1* | 10/2020 | Terashima .......... H01L 29/7805 |
| 2021/0082702 A1* | 3/2021 | Agata ................. H01L 27/0664 |

FOREIGN PATENT DOCUMENTS

| | | | |
|---|---|---|---|
| JP | 2014175517 A | 9/2014 | |
| JP | 2017135339 A | 8/2017 | |
| JP | 2019161168 A | 9/2019 | |
| WO | 2016030966 A1 | 3/2016 | |
| WO | 2018110703 A1 | 6/2018 | |
| WO | 2019078131 A1 | 4/2019 | |
| WO | 2019116748 A1 | 6/2019 | |
| WO | WO2019116748 * | 6/2019 | ............. 29/78 |

* cited by examiner

SEMICONDUCTOR DEVICE

The contents of the following Japanese patent application(s) are incorporated herein by reference:
NO. 2020-006110 filed in JP on Jan. 17, 2020
NO. PCT/JP2020/044531 filed in WO on Nov. 30, 2020

BACKGROUND

1. Technical Field

The present invention relates to a semiconductor device.

2. Related Art

Conventionally, in a semiconductor device in which a transistor portion such as an insulated gate bipolar transistor (IGBT) and a diode portion are formed on the same substrate, there is known a technique of irradiating a predetermined depth position of a semiconductor substrate with a particle beam such as helium ions to provide a lifetime control region including a lifetime killer (for example, Patent Literatures 1 and 2).
Patent Literature 1: Japanese Patent Application Publication No. 2017-135339
Patent Literature 2: Japanese Patent Application Publication No. 2014-175517

DESCRIPTION OF EXEMPLARY EMBODIMENTS

Figure 1A:
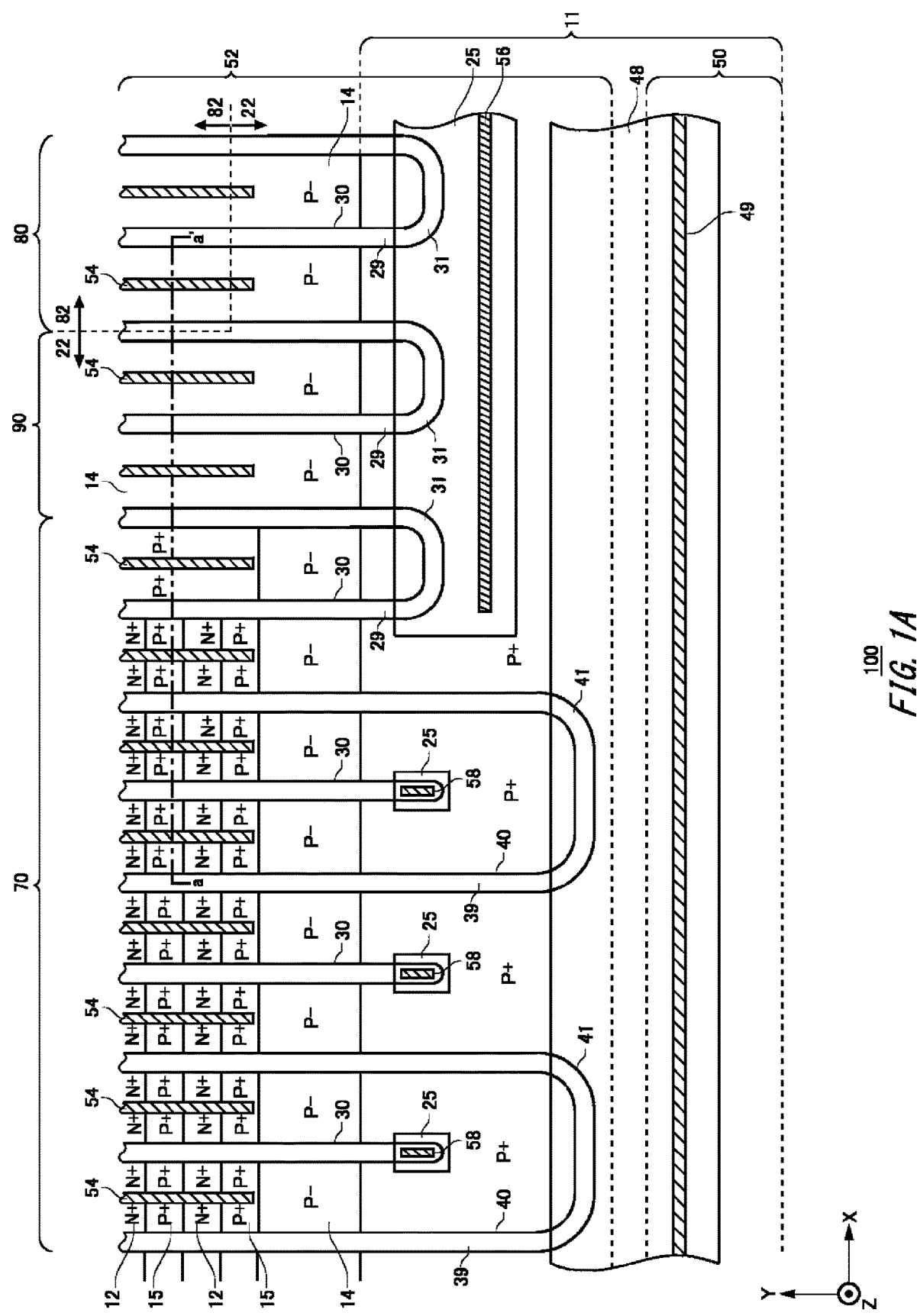
FIG. 1A is a partial top view of a semiconductor device 100 according to Example 1 of the present embodiment.

Hereinafter, the present invention will be described through embodiments of the invention, but the following embodiments do not limit the invention according to the claims. In addition, not all combinations of features described in the embodiments are essential to the solution of the invention.

In the present specification, one side in a direction parallel to the depth direction of the semiconductor substrate is referred to as "upper", and the other side is referred to as "lower". One of two main surfaces of a substrate, a layer, or another member is referred to as a front surface, and the other surface is referred to as a back surface. The "upper" and "lower" directions are not limited to the gravity direction or the direction at the time of mounting the semiconductor device.

In the present specification, technical matters may be described using orthogonal coordinate axes of an X axis, a Y axis, and a Z axis. The orthogonal coordinate axes merely identify relative positions of the components, and do not limit a specific direction. For example, the Z axis does not exclusively indicate the height direction with respect to the ground. The +Z axis direction and the −Z axis direction are opposite to each other. In a case where the positive and negative are not described and described as the Z axis direction, it means a direction parallel to the +Z axis and the −Z axis.

In the present specification, orthogonal axes parallel to the front surface and the back surface of the semiconductor substrate are defined as an X axis and a Y axis. An axis perpendicular to the front surface and the back surface of the semiconductor substrate is defined as a Z axis. In the present specification, the Z axis direction may be referred to as a depth direction. In addition, in the present specification, a direction parallel to the front surface and the back surface of the semiconductor substrate including the X axis and the Y axis may be referred to as a horizontal direction.

In the present specification, the term "same" or "equal" may include a case where there is an error due to manufacturing variation or the like. The error is, for example, within 10%.

In the present specification, the conductivity type of the doping region doped with impurities is described as a P type or N type. In the present specification, the impurity may particularly mean either an N type donor or a P type acceptor, and may be described as a dopant. In the present specification, doping means introducing a donor or an acceptor into a semiconductor substrate to form a semiconductor exhibiting a conductivity type of an N type or a semiconductor exhibiting a conductivity type of a P type.

In the present specification, the doping concentration means the concentration of donors or the concentration of the acceptors in the thermal equilibrium state. In the present specification, the net doping concentration means the net concentration obtained by adding the donor concentration as the concentration of positive ions and the acceptor concentration as the concentration of negative ions including the polarity of charges. As an example, if the donor concentration is $N_D$ and the acceptor concentration is $N_A$, the net doping concentration at an arbitrary position is $N_D - N_A$.

The donor has a function of supplying electrons to the semiconductor. The acceptor has a function of receiving electrons from the semiconductor. The donor and acceptor are not limited to the impurities themselves. For example, a VOH defect in which vacancies (V), oxygen (O), and hydrogen (H) are bonded in a semiconductor functions as a donor for supplying electrons.

In the present specification, when described as a P+ type or N+ type, it means that the doping concentration is higher than that of a P type or N type, and when described as a P− type or N− type, it means that the doping concentration is lower than that of the P type or N type. In addition, in the present specification, the description of the P++ type or N++ type means that the doping concentration is higher than that of the P+ or N+ type.

In the present specification, the chemical concentration refers to the concentration of impurities measured regardless of the state of electrical activation. The chemical concentration can be measured by, for example, secondary ion mass spectrometry (SIMS). The above-described net doping concentration can be measured by a capacitance-voltage profiling (CV profiling). In addition, the carrier concentration measured by a spread resistance profiling method (SRP method) may be a net doping concentration. The carrier concentration measured by the CV profiling or the SRP method may be a value in a thermal equilibrium state. In addition, since the donor concentration is sufficiently larger than the acceptor concentration in the N type region, the carrier concentration in the region may be used as the donor concentration. Similarly, in the P type region, the carrier concentration in the region may be set as the acceptor concentration.

In addition, in a case where the concentration distribution of the donor, acceptor, or net doping has a peak, the peak value may be the concentration of donors, acceptors, or net doping in the region. In a case where the concentration of the donor, the acceptor, or the net doping is approximately uniform or the like, an average value of the concentration of the donor, the acceptor, or the net doping in the corresponding region may be used as the concentration of the donor, the acceptor, or the net doping.

The carrier concentration measured by the SRP method may be lower than the concentration of donors or acceptors. In a range where the current flows when measuring a spreading resistance, there is a case where the carrier mobility of the semiconductor substrate is lower than the value of the crystal state. The decrease in carrier mobility occurs due to disorder of the crystal structure caused by a lattice defect or the like to make the carrier scatter.

The concentration of donors or acceptors calculated from the carrier concentration measured by the CV profiling or the SRP method may be lower than the chemical concentration of elements indicating the donor or the acceptor. As an example, the donor concentration of phosphorus or arsenic as a donor, or the acceptor concentration of boron as an acceptor in a silicon semiconductor is about 99% of its chemical concentration. On the other hand, the donor concentration of hydrogen as a donor in the silicon semiconductor is about 0.1% to 10% of the chemical concentration of hydrogen.

EXAMPLE 1

FIG. 1A is a partial top view of a semiconductor device 100 according to Example 1 of the present embodiment. The semiconductor device 100 includes a semiconductor substrate having a transistor portion 70 including a transistor device such as an IGBT and a diode portion 80 including a diode device such as a freewheeling diode (FWD).

Note that, in the present specification, when simply referred to as a top view, it means viewing from the front surface side of the semiconductor substrate. In the present example, an arrangement direction of the transistor portion 70 and the diode portion 80 in a top view is referred to as an X axis, a direction perpendicular to the X axis on the front surface of the semiconductor substrate is referred to as a Y axis, and a direction perpendicular to the front surface of the semiconductor substrate is referred to as a Z axis.

Each of the transistor portion 70 and the diode portion 80 may have a longitudinal length in the extending direction. That is, the length of the transistor portion 70 in the Y axis direction is larger than the width thereof in the X axis direction. Similarly, the length of the diode portion 80 in the Y axis direction is larger than the width thereof in the X axis direction. The extending direction of the transistor portion 70 and the diode portion 80 may be the same as the longitudinal direction of each trench portion to be described later.

The diode portion 80 has an N+ type cathode region in a region in contact with the back surface of the semiconductor substrate. In the present specification, a region where the cathode region is provided is referred to as a diode portion 80. That is, the diode portion 80 is a region overlapping the cathode region in a top view. On the other hand, the transistor portion 70 has a P+ type collector region in a region in contact with the back surface of the semiconductor substrate.

The semiconductor device 100 of the present example includes a gate trench portion 40, a dummy trench portion 30, a well region 11, an emitter region 12, a base region 14, and an extraction region 15 provided inside the front surface side of the semiconductor substrate. Each of the gate trench portion 40 and the dummy trench portion 30 is an example of a trench portion.

In addition, the semiconductor device 100 of the present example includes a gate metal layer 50 and an emitter electrode 52 provided above the front surface of the semiconductor substrate. The gate metal layer 50 and the emitter electrode 52 are provided separately from each other.

An interlayer dielectric film is provided between the emitter electrode 52 and the gate metal layer 50, and the front surface of the semiconductor substrate, but is omitted in FIG. 1A. In the interlayer dielectric film of the present example, contact holes 49, 54, 56, and 58 are provided through the interlayer dielectric film. In FIG. 1A, each contact hole is hatched with oblique lines.

The emitter electrode 52 is provided above the gate trench portion 40, the dummy trench portion 30, the well region 11, the emitter region 12, the base region 14, and the extraction region 15. The emitter electrode 52 is in contact with the emitter region 12, the base region 14, and the extraction region 15 in the front surface of the semiconductor substrate through the contact hole 54.

The emitter electrode 52 is connected to a dummy conductive portion in the dummy trench portion 30 through the contact hole 56 or the contact hole 58. A connection portion 25 formed of a material having conductivity such as polysilicon doped with impurities may be provided between the emitter electrode 52 and the dummy conductive portion. Each of the connection portions 25 is provided on the front surface of the semiconductor substrate via an insulating film.

The gate metal layer 50 is in contact with a gate runner 48 through the contact hole 49. The gate runner 48 may be formed of polysilicon doped with impurities or the like. The gate runner 48 is connected to the gate conductive portion in the gate trench portion 40 on the front surface of the semiconductor substrate. The gate runner 48 is not electrically connected to the dummy conductive portion in the dummy trench portion 30 and the emitter electrode 52.

The gate runner 48 and the emitter electrode 52 may be electrically separated from each other by an insulator such as an interlayer dielectric film and an oxide film. The gate runner 48 of the present example is provided from below the contact hole 49 to the edge portion of the gate trench portion 40. At the edge portion of the gate trench portion 40, the gate conductive portion is exposed on the front surface of the semiconductor substrate and is in contact with the gate runner 48.

The emitter electrode 52 and the gate metal layer 50 are formed of a conductive material containing metal. For example, it is formed of polysilicon, aluminum, or an aluminum-silicon alloy. Each electrode may have a barrier metal formed of titanium, a titanium compound, or the like in a lower layer of a region formed of aluminum or the like.

Each electrode may have a plug formed of tungsten or the like in the contact hole. The plug may have a barrier metal on the side in contact with the semiconductor substrate, may be embedded with tungsten so as to be in contact with the barrier metal, and may be formed of aluminum or the like on the tungsten.

Note that the plug is provided in a contact hole in contact with the extraction region 15 or the base region 14. In addition, a P++ type plug region 17 having a higher doping concentration than the extraction region 15 is formed below the contact hole of the plug. This can improve the contact resistance between the barrier metal and the extraction region 15. In addition, the depth of the plug region 17 is about 0.1 µm or less, and has a region as small as 10% or less as the depth of the extraction region 15.

The plug region 17 has the following characteristics. In the operation of the transistor portion 70, a latch-up withstand capability is improved by improving the contact resistance. On the other hand, in the operation of the diode portion 80, in a case where there is no plug region, the contact resistance between the barrier metal and the base region 14 is high, and the conduction loss and the switching loss increase. However, by providing the plug region 17, the conduction loss and the switching loss can be suppressed from increasing.

The well region 11 is provided to overlap with the gate runner 48. The well region 11 is also provided to extend with a predetermined width in a range not overlapping with the gate runner 48. The well region 11 of the present example is provided away from the end of the contact hole 54 in the Y axis direction toward the gate runner 48 side. The well region 11 is a region of a second conductivity type having a higher doping concentration than the base region 14.

The base region 14 in the present example is a P− type, and the well region 11 is a P+ type. In addition, the well region 11 is formed from the front surface of the semiconductor substrate to a position deeper than the lower end of the base region 14.

Each of the transistor portion 70 and the diode portion 80 has a plurality of trench portions arranged in the arrangement direction. In the transistor portion 70 of the present example, one or more gate trench portions 40 and one or more dummy trench portions 30 are alternately provided along the arrangement direction. In the diode portion 80 of the present example, a plurality of dummy trench portions 30 are provided along the arrangement direction. The diode portion 80 of the present example is not provided with the gate trench portion 40.

The gate trench portion 40 of the present example may have two straight portions 39 (portions of the trenches which are straight along the extending direction) extending along the extending direction perpendicular to the arrangement direction and the edge portion 41 connecting the two straight portions 39.

At least a part of the edge portion 41 may be provided in a curved shape in a top view. The end portions of the two straight portions 39 in the Y axis direction are connected to the gate runner 48 at the edge portion 41, so that the edge portion functions as a gate metal layer to the gate trench portion 40. On the other hand, by forming the edge portion 41 in a curved shape, it is possible to reduce the electric field strength at the time of gate bias at the end portion rather than being completed by the straight portion 39.

In the transistor portion 70, the dummy trench portion 30 is provided between the straight portions 39 of the gate trench portion 40. One dummy trench portion 30 may be provided between the straight portions 39, and a plurality of dummy trench portions 30 may be provided.

The dummy trench portion 30 may not be provided between the straight portions 39, and the gate trench portion 40 may be provided. With such a structure, since the electron current from the emitter region 12 can be increased, the ON voltage is reduced.

The dummy trench portion 30 may have a linear shape extending in the extending direction, and may have a straight portion 29 and an edge portion 31 similar to the gate trench portion 40. The semiconductor device 100 illustrated in FIG. 1A includes both the linear dummy trench portion 30 not having the edge portion 31 and the dummy trench portion 30 having the edge portion 31.

The diffusion depth of the well region 11 may be deeper than the depths of the gate trench portion 40 and the dummy trench portion 30. The end portions of the gate trench portion 40 and the dummy trench portion 30 in the Y axis direction are provided in the well region 11 in a top view. That is, the bottom portion of each trench portion in the depth direction is covered with the well region 11 at the end portion of each trench portion in the Y axis direction. As a result, electric field strength at the bottom portion of each trench portion can be reduced.

A mesa portion is provided between the trench portions in the arrangement direction. The mesa portion refers to a region sandwiched between the trench portions inside the semiconductor substrate. As an example, the depth position of the mesa portion is from the front surface of the semiconductor substrate to the lower end of the trench portion.

The mesa portion of the present example is sandwiched between adjacent trench portions in the X axis direction, and is provided to extend in the extending direction (Y axis direction) along the trench in the front surface of the semiconductor substrate. As described later with FIG. 1B, in the present example, the transistor portion 70 is provided with a mesa portion 60, and the diode portion 80 is provided with a mesa portion 61. In the case of simply referring to as a mesa portion in the present specification, the mesa portion refers to each of the mesa portion 60 and the mesa portion 61.

The base region 14 is provided in each mesa portion. In each mesa portion of the transistor portion 70, at least one of the emitter region 12 of the first conductivity type and the extraction region 15 of the second conductivity type may be provided in a region sandwiched between the base regions 14 in a top view. The emitter region 12 in the present example is an N+ type, and the extraction region 15 is a P+ type. The emitter region 12 and the extraction region 15 may be provided between the base region 14 and the front surface of the semiconductor substrate 10 in the depth direction.

The mesa portion of the transistor portion 70 has the emitter region 12 exposed to the front surface of the semiconductor substrate. The emitter region 12 is provided in contact with the gate trench portion 40. The mesa portion in contact with the gate trench portion 40 may be provided with the extraction region 15 exposed to the front surface of the semiconductor substrate.

Each of the extraction region 15 and the emitter region 12 in the mesa portion 60 is provided from one trench portion to the other trench portion in the X axis direction. As an example, the extraction region 15 and the emitter region 12 of the mesa portion are alternately disposed along the extending direction (Y axis direction) of the trench portion.

In another example, the extraction region 15 and the emitter region 12 of the mesa portion 60 may be provided in a stripe shape along the extending direction (Y axis direction) of the trench portion. For example, the emitter region 12 is provided in a region in contact with the trench portion, and the extraction region 15 is provided in a region sandwiched by the emitter region 12.

However, in the transistor portion 70, the emitter region 12 is not provided in the mesa portion adjacent to an injection suppression region 90 to be described later, and the extraction region 15 exposed to the front surface of the semiconductor substrate is provided. The extraction region 15 may be provided in contact with the dummy trench portion 30 in a region sandwiched between the base regions 14 in a top view.

The emitter region 12 is not provided in the mesa portion of the diode portion 80. The base region 14 may be provided on the upper surface of the mesa portion of the diode portion 80. The base region 14 may be disposed in the entire mesa portion of the diode portion 80.

The contact hole 54 is provided above each mesa portion. The contact hole 54 is disposed in a region sandwiched between the base regions 14 in the extending direction (Y axis direction). The contact hole 54 of the present example is provided above each region of the extraction region 15, the base region 14, and the emitter region 12. The contact hole 54 may be disposed at the center in the arrangement direction (X axis direction) of the mesa portion.

In the diode portion 80, an N+ type cathode region 82 is provided in a region adjacent to the back surface of the semiconductor substrate. In the back surface of the semiconductor substrate, a P+ type collector region 22 may be provided in a region where the cathode region 82 is not provided. In FIG. 1A, the boundary between the cathode region 82 and the collector region 22 is indicated by a dotted line.

The cathode region 82 is disposed away from the well region 11 in the Y axis direction. As a result, by securing a distance between the cathode region 82 and the P-type region (well region 11) having a relatively high doping concentration and formed up to a deep position, hole injection from the well region 11 can be suppressed, so that the reverse recovery loss can be reduced. The end portion of the cathode region 82 in the Y axis direction of the present example is disposed farther from the well region 11 than the end portion of the contact hole 54 in the Y axis direction. In another example, the end portion of the cathode region 82 in the Y axis direction may be disposed between the well region 11 and the contact hole 54.

The transistor portion 70 has an injection suppression region 90 that suppresses injection of the carrier of the second conductivity type at an end portion on the diode portion 80 side in a top view of the semiconductor substrate.

In the injection suppression region 90, a P+ type collector region 22 is provided on the back surface of the semiconductor substrate. That is, although the injection suppression region 90 is a part of the transistor portion 70, in the present specification, the transistor portion 70 and the injection suppression region 90 will be basically described separately.

On the upper surface of the injection suppression region 90, unlike the transistor portion 70, the emitter region 12 and the extraction region 15 are not provided, and the base region 14 is provided. In addition, unlike the transistor portion 70, the injection suppression region 90 does not have the gate trench portion 40 but has the dummy trench portion 30. In FIG. 1A, the injection suppression region 90 is illustrated as two mesa portions adjacent to each other from the dummy trench portion 30, but the present invention is not limited thereto. The injection suppression region 90 may have more than 2 mesa portions.

When the diode portion 80 conducts, the electron current flows from the cathode region 82 to the base region 14 operating as the anode layer. When the electron current reaches the base region 14, conductivity modulation occurs, and the hole current flows from the anode layer. However, since the base region 14 is also provided in the transistor portion 70, the electron current diffused from the cathode region 82 to the base regions 14 of the transistor portion 70 and the injection suppression region 90 is generated.

The electron current diffused toward the transistor portion 70 promotes hole injection from the base region 14 and the extraction region 15 of the transistor portion 70. Since the boron concentration in the extraction region 15 is 100 times higher than that in the base region 14, the hole density of the substrate 10 becomes high. As a result, it takes time until holes disappear when the diode portion 80 is turned off, so that the reverse recovery peak current increases and the reverse recovery loss increases.

In the semiconductor device 100 of the present example, by providing the injection suppression region 90 on the diode portion 80 side of the transistor portion 70, the distance between the cathode region 82 and the base region 14 and the extraction region 15 of the transistor portion 70 becomes long. As a result, at the time of conduction of the diode portion 80, the ratio of the extraction region 15 of the transistor portion 70 to the diffusion range of the electron current decreases, and thus hole injection is suppressed.

Figure 1B:
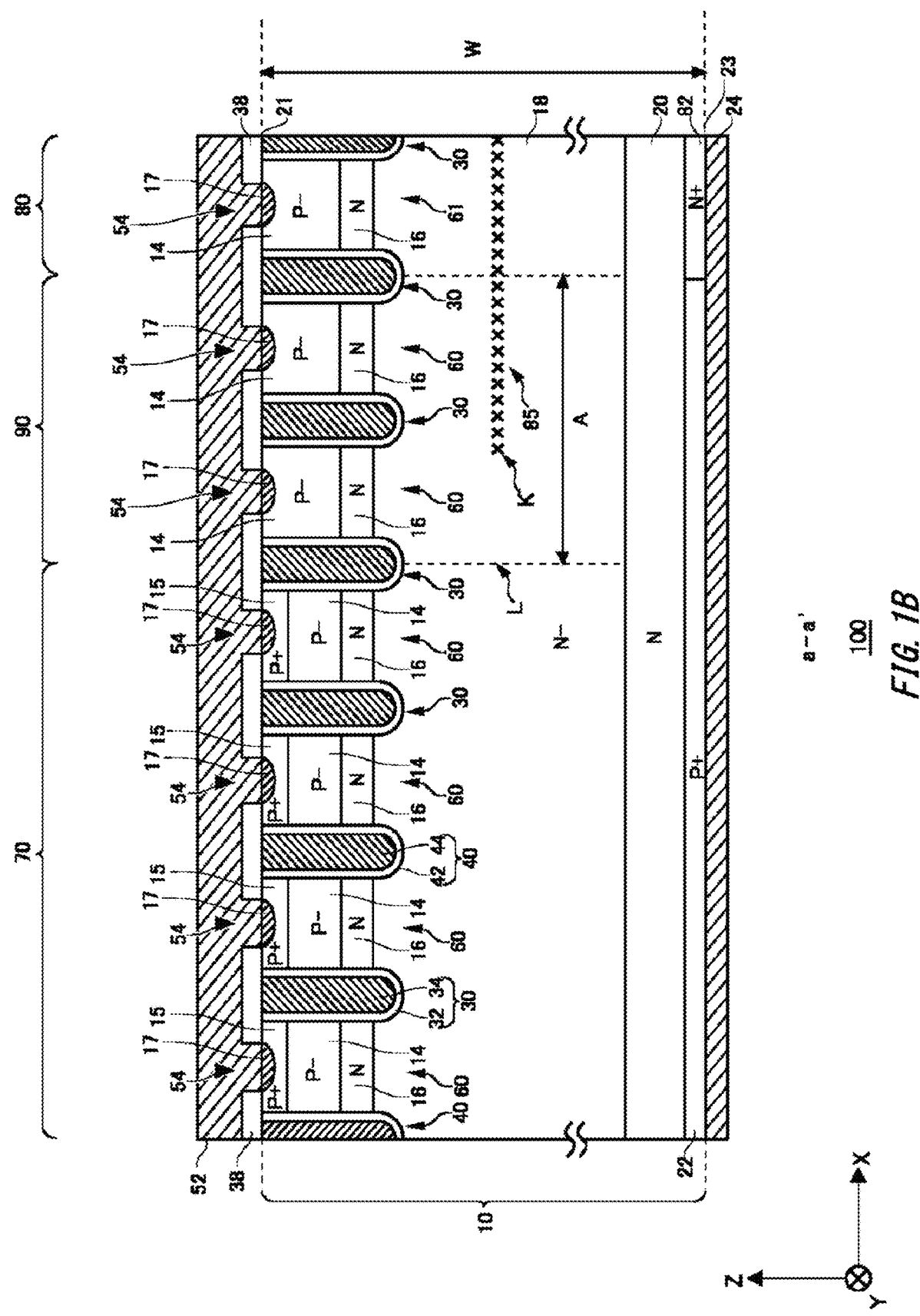
FIG. 1B is a diagram illustrating a cross section taken along line a-a' in FIG. 1A.

FIG. 1B is a diagram illustrating a cross section taken along line a-a' in FIG. 1A. The a-a' cross section is an XZ plane passing through the emitter region 12, the base region 14, the gate trench portion 40, and the dummy trench portion 30. The semiconductor device 100 of the present example includes the substrate 10, the interlayer dielectric film 38, the emitter electrode 52, and a collector electrode 24 in the a-a' cross section.

The interlayer dielectric film 38 is provided in a front surface 21 of the substrate 10. The interlayer dielectric film 38 is an insulating film such as silicate glass to which an impurity such as boron or phosphorus is added. The interlayer dielectric film 38 may be in contact with the front surface 21, and another film such as an oxide film may be provided between the interlayer dielectric film 38 and the front surface 21. The interlayer dielectric film 38 is provided with the contact hole 54 described in FIG. 1A.

The emitter electrode 52 is provided in the front surface 21 of the substrate 10 and the upper surface of the interlayer dielectric film 38. The emitter electrode 52 passes through the contact hole 54 of the interlayer dielectric film 38 and is in electrical contact with the front surface 21. A contact plug such as tungsten (W) may be provided inside the contact hole 54. The collector electrode 24 is provided in a back surface 23 of the substrate 10. The emitter electrode 52 and the collector electrode 24 are formed of a material containing metal.

The substrate 10 may be a silicon substrate, a silicon carbide substrate, a nitride semiconductor substrate such as gallium nitride, or the like. The substrate 10 of the present example is a silicon substrate.

The substrate 10 has a drift region 18 of the first conductivity type. The drift region 18 of the present example is an N– type. The drift region 18 may be a region remaining without other doping regions provided in the substrate 10.

Above the drift region 18, one or more accumulation regions 16 may be provided in the Z axis direction. The accumulation region 16 is a region in which the same dopant as the drift region 18 is accumulated at a higher concentration than the drift region 18. The doping concentration of the accumulation region 16 is higher than the doping concentration of the drift region 18. By providing the accumulation region 16, the injection-enhancement effect (IE effect) of the carrier can be enhanced, and the ON voltage can be reduced.

In the transistor portion 70, the emitter region 12 is provided above the base region 14 in contact with the front surface 21. The emitter region 12 is provided in contact with the gate trench portion 40. The doping concentration of the emitter region 12 is higher than the doping concentration of the drift region 18. The dopant of the emitter region 12 is, for example, arsenic (As), phosphorus (P), antimony (Sb), or the like.

The width A of the injection suppression region 90 in the arrangement direction (X axis direction in FIG. 1B) ranges from 20 μm to 900 μm. In addition, the following Expression (1) is established between the width A of the injection suppression region 90 and the substrate thickness W of the semiconductor device 100.

$$A \leq 6W \quad \text{[Expression (1)]}$$

The substrate thickness W indicates a thickness from the upper surface of the base region 14 of the diode portion 80 to the lower surface of the cathode region 82. As the substrate thickness W increases, the diffusion region of electrons of the cathode region 82 of the diode portion 80 increases, and thus, it is found that the reverse recovery and the turn-on loss are reduced by Expression (1).

In addition, in the transistor portion 70, in the mesa portion 60 on the injection suppression region 90 side, the extraction region 15 is provided in contact with the front surface 21 above the base region 14. The extraction region 15 may be provided in contact with the dummy trench portion 30.

The base region 14 exposed to the front surface 21 is provided in the diode portion 80 and the injection suppression region 90. The base region 14 of the diode portion 80 operates as an anode.

A buffer region 20 of the first conductivity type may be provided below the drift region 18. The buffer region 20 of the present example is an N type. The doping concentration of the buffer region 20 is higher than the doping concentration of the drift region 18. The buffer region 20 may function as a field stop layer that prevents a depletion layer extending from the lower surface side of the base region 14 from reaching the collector region 22 and the cathode region 82.

In the transistor portion 70 and the injection suppression region 90, the collector region 22 is provided below the buffer region 20. The collector region 22 of the injection suppression region 90 may be provided in contact with the cathode region 82 in the back surface 23.

In the diode portion 80, the cathode region 82 is provided below the buffer region 20. The cathode region 82 may be provided at the same depth as the transistor portion 70 and the collector region 22 of the injection suppression region 90. The diode portion 80 may function as a freewheeling diode (FWD) that allows a freewheeling current that conducts in the reverse direction to flow when the transistor portion 70 is turned off.

The substrate 10 is provided with the gate trench portion 40 and the dummy trench portion 30. The gate trench portion 40 and the dummy trench portion 30 are provided so as to penetrate the base region 14 and the accumulation region 16 from the front surface 21 and reach the drift region 18. The trench portion penetrating the doping region is not limited to those manufactured in the order of forming the doping region and then forming the trench portion. A case where a doping region is formed between the trench portions after the trench portion is formed is also included in a case where the trench portion penetrates the doping region.

The gate trench portion 40 includes a gate trench, a gate insulating film 42, and a gate conductive portion 44 provided in the front surface 21. The gate insulating film 42 is provided to cover the inner wall of the gate trench. The gate insulating film 42 may be formed by oxidizing or nitriding the semiconductor of the inner wall of the gate trench. The gate conductive portion 44 is provided on the inner side of the gate insulating film 42 inside the gate trench. The upper surface of the gate conductive portion 44 may be in the same XY plane as the front surface 21. The gate insulating film 42 insulates the gate conductive portion 44 from the substrate 10. The gate conductive portion 44 is formed of a semiconductor such as polysilicon doped with impurities.

The gate conductive portion 44 may be provided longer than the base region 14 in the depth direction. The gate trench portion 40 is covered with the interlayer dielectric film 38 on the front surface 21. If a predetermined voltage is applied to the gate conductive portion 44, a channel by an inversion layer of electrons is formed in a surface layer of the interface in contact with the gate trench in the base region 14.

The dummy trench portion 30 may have the same structure as the gate trench portion 40 in the XZ cross section. The dummy trench portion 30 includes a dummy trench provided in the front surface 21, a dummy insulating film 32, and a dummy conductive portion 34. The dummy insulating film 32 is provided to cover the inner wall of the dummy trench. The dummy insulating film 32 may be formed by oxidizing or nitriding the semiconductor of the inner wall of the dummy trench. The dummy conductive portion 34 is provided on the inner side of the dummy insulating film 32 inside the dummy trench. The upper surface of the dummy conductive portion 34 may be in the same XY plane as the front surface 21. The dummy insulating film 32 insulates the dummy conductive portion 34 from the substrate 10. The dummy conductive portion 34 may be formed of the same material as the gate conductive portion 44.

The gate trench portion 40 and the dummy trench portion 30 of the present example are covered with the interlayer dielectric film 38 in the front surface 21. Note that the bottom portions of the dummy trench portion 30 and the gate trench portion 40 may have a curved surface shape protruding downward (a curved shape in a cross section).

In the diode portion 80, a lifetime control region 85 including a lifetime killer is locally provided in the drift region 18. The lifetime control region 85 promotes recombination of holes generated in the base region 14 and electrons injected from the cathode region 82 when the diode portion 80 is turned off, and suppresses a peak current at the time of reverse recovery.

The lifetime control region 85 may be formed by irradiating proton or helium from the front surface 21 or the back surface 23. As an example, a region where the lifetime control region 85 is not formed is shielded by a metal or a resist mask, and the transistor portion 70 and the diode portion 80 are irradiated with the light. Proton or helium does not irradiate the region shielded by the mask.

In FIG. 1B, the peak position of the concentration distribution of the lifetime killer in the Z axis direction is indicated by a symbol "x". The peak position of the lifetime control region 85 in the Z axis direction of the present example may be equal to the position of the lower surface of the well region 11 in the Z axis direction, or may be provided below the position of the lower surface of the well region 11 in the Z axis direction. Further, the lifetime control region 85 may be formed so as to have a plurality of peaks of the concentration distribution of the lifetime killer in the Z axis direction.

The lifetime killer can form crystal defects inside the semiconductor substrate 10 by injecting helium or protons that can be injected at a predetermined depth position as an example.

In general, the lifetime control region is provided over the diode portion 80 and the transistor portion 70. At the time of conduction of the diode portion, a hole current directed to the cathode region 82 is generated not only from the base region 14 of the diode portion but also from the base region 14 of the transistor portion. This is because it is necessary to promote the carrier disappearance by providing the lifetime control region 85 in order to reduce the reverse recovery loss at the time of turn-off.

However, in the case of forming such a lifetime control region 85, helium or protons are irradiated in the trench portions of the transistor portion 70 and the diode portion 80, the trench oxide film is damaged, and the interface state changes.

Therefore, when the gate voltage is applied, a tunnel current easily flows through the irradiated trench oxide film as compared with the unirradiated trench oxide film. Therefore, in the region where the emitter region 12 of the lifetime control region 85 is present, the voltage is lower than that in the region where the lifetime control region 85 of the transistor portion 70 is not provided.

In addition, in the region where the lifetime control region 85 is provided, since the interface state of the trench oxide film varies non-uniformly, the threshold voltage is likely to vary, and the turn-off withstand capability may decrease due to non-uniformity of the threshold voltage in each layer of the mesa portion or non-uniformity of the threshold voltage between the mesa portions when connected in parallel. On the other hand, in the region without the emitter region 12, even if the interface state of the trench oxide film changes, the electron current does not flow, so that the threshold voltage does not decrease.

In the present example, the lifetime control region 85 is not formed under the emitter region 12 of the transistor portion 70. Therefore, since the irradiated helium or protons do not change the interface state of the trench oxide film under the emitter region 12 of the transistor portion 70, the threshold voltage in the lifetime control region 85 has the same value as that of the transistor portion 70 not provided with the lifetime control region 85.

Since the emitter region 12 is not provided in the lifetime control region 85 as described above, the threshold voltage in the transistor portion 70 does not decrease. On the other hand, since the lifetime control region 85 is not provided in the transistor portion 70, many hole injections occur from the extraction region 15 of the transistor portion 70, it takes time to extract carriers at the time of reverse recovery, and reverse recovery and turn-on loss increase. Therefore, by forming the injection suppression region 90, hole injection from the transistor portion 70 can be suppressed at the time of conduction of the diode portion 80, so that reverse recovery and turn-on loss can be reduced.

As illustrated in FIG. 1B, the lifetime control region 85 of the present example is continuously provided from the diode portion 80 to at least a part of the injection suppression region 90 in the X axis direction. An end portion K on the negative side on the X axis of the lifetime control region 85 may be located at a position retracted to the positive side on the X axis from the end portion on the transistor portion 70 side of the injection suppression region 90, that is, in the injection suppression region 90.

In the injection suppression region 90, the interval between the end portion K of the lifetime control region 85 in the arrangement direction (X axis direction) and a boundary portion L between the injection suppression region 90 and the transistor portion 70 may be 1 μm or more.

The lifetime control region 85 is formed by, for example, irradiating protons or helium from the front surface 21 through a thick resist mask of 30 to 80 μm. Therefore, if the lifetime control region 85 is not slightly retracted into the injection suppression region 90, the lifetime control region 85 is formed in the transistor portion 70 when the inclination angle of the thick resist varies, and the threshold voltage tends to decrease or vary.

Therefore, by providing the lifetime control region 85 up to a position slightly retracted in the injection suppression region 90, even if the inclination angle of the resist mask varies, the lifetime control region 85 is not formed in the transistor portion 70, and it is possible to prevent a decrease or variation in the threshold voltage.

In addition, since the extraction region 15 is not provided in the injection suppression region 90 of the present example and there is a distance from the cathode region 82, it is possible to suppress a hole current generated in the extraction region 15 when the diode portion 80 is conducted.

Further, in the lifetime control region 85 of the present example, the distance between the end portion K and the cathode region 82 is longer than that in a case where the lifetime control region 85 is provided only in the diode portion 80. Therefore, by providing the lifetime control region 85, recombination of the hole current generated in the base region 14 of the injection suppression region 90 and the electrons flowing in from the cathode region 82 is further promoted. Therefore, the peak current of the reverse recovery of the diode portion 80 can be suppressed as compared with the case where the lifetime control region 85 is not provided.

As described above, in the lifetime control region 85 of the present example, as compared with the case where the lifetime control region 85 is also provided in the transistor portion 70, the threshold voltage in the transistor portion 70 does not decrease or vary, and the hole injection from the transistor portion 70 can be suppressed at the time of conduction of the diode portion 80, so that the reverse recovery and the turn-on loss are reduced.

Figure 2A:
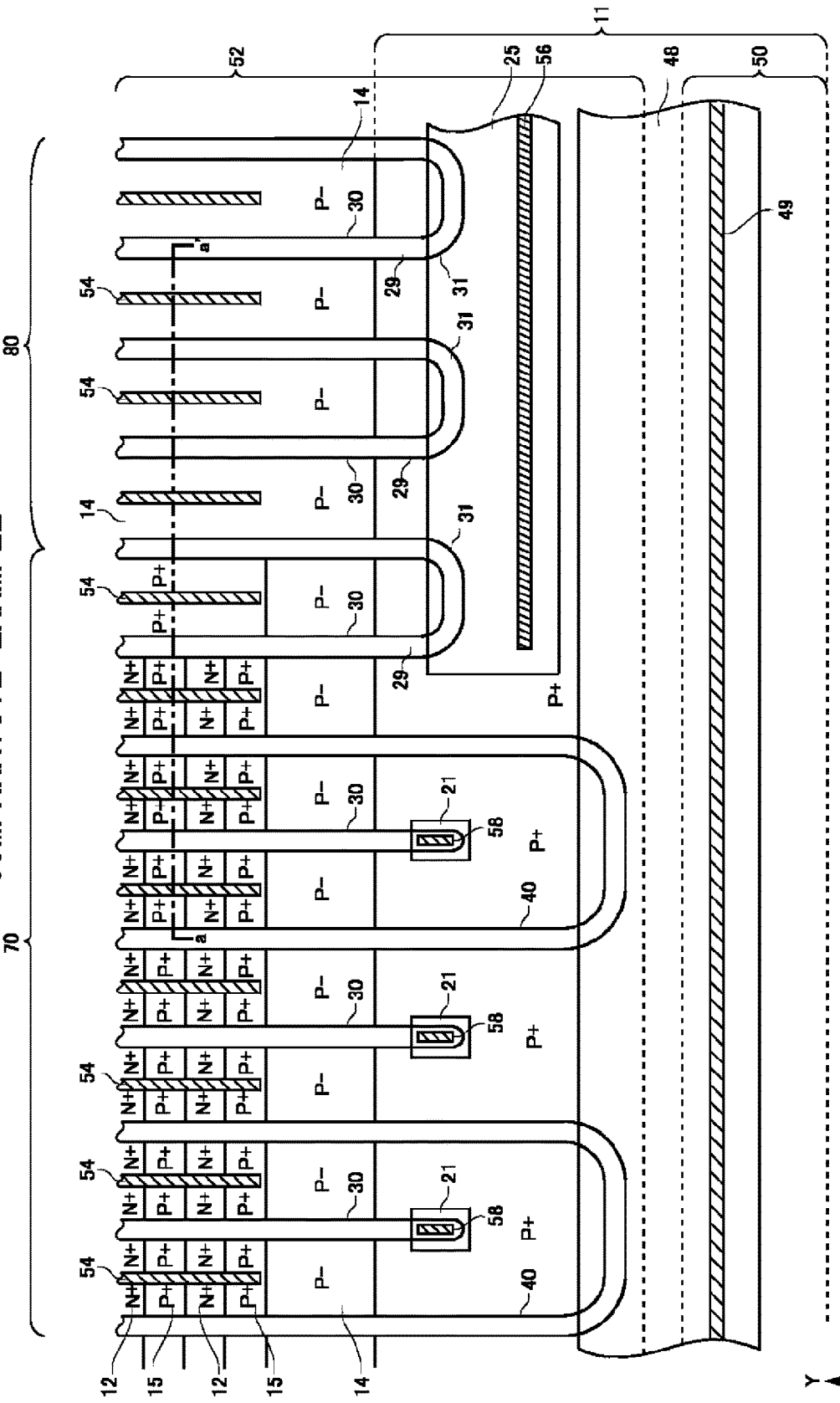
FIG. 2A is a diagram illustrating an example of a front surface of a semiconductor device 1100 according to a comparative example
Figure 2B:
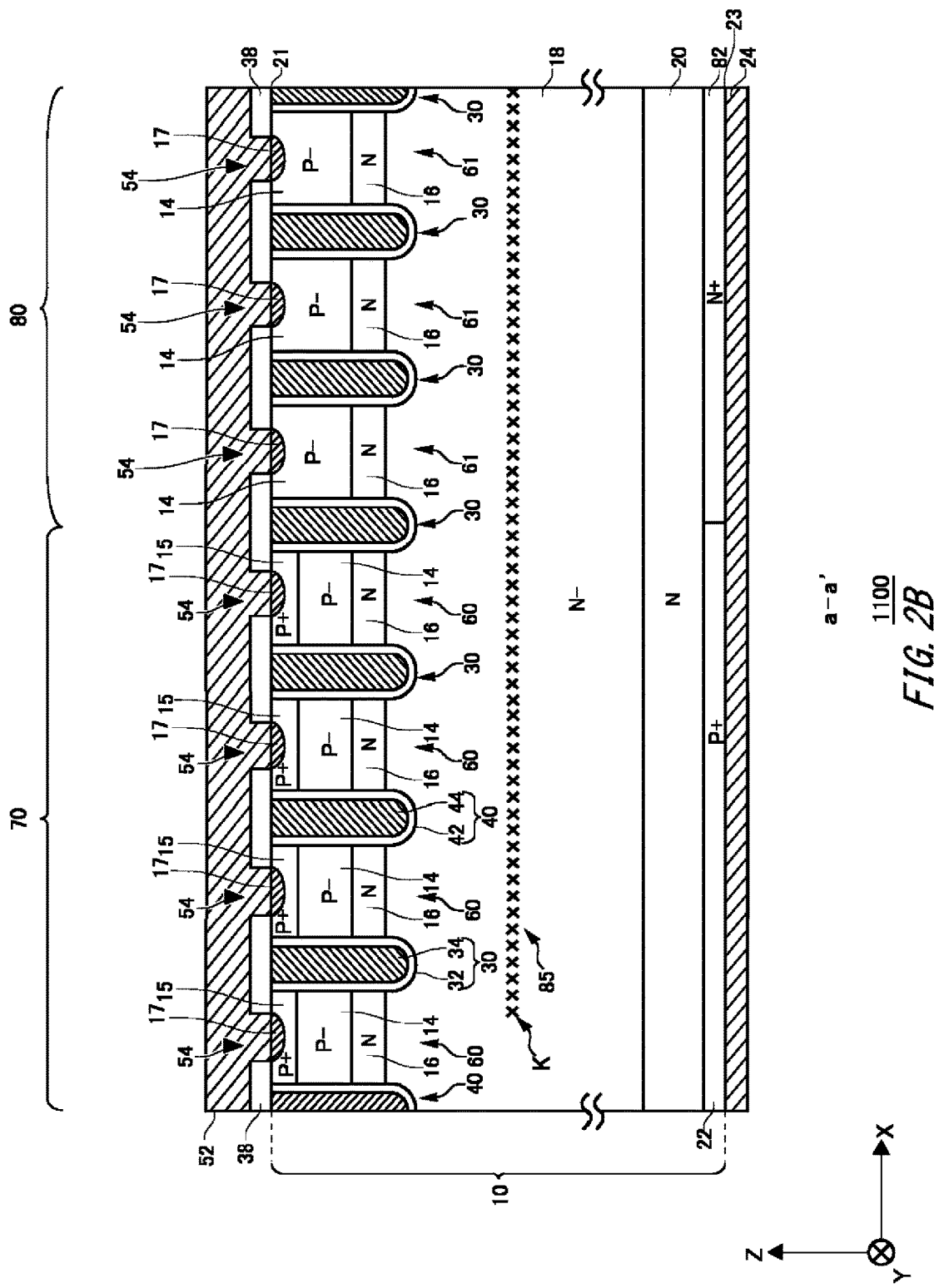
FIG. 2B is a diagram illustrating a cross section taken along line a-a' in FIG. 2A.

Next, effects of the semiconductor device 100 will be described by comparison with the semiconductor device 1100 according to a comparative example FIG. 2A is a diagram illustrating an example of the front surface of the semiconductor device 1100 according to a comparative example. FIG. 2B is a diagram illustrating a cross section taken along line a-a' in FIG. 2A. Here, elements common to the semiconductor device 100 are denoted by the same reference numerals, and description thereof is omitted.

The semiconductor device 1100 includes the transistor portion 70 and the diode portion 80. The mesa portion 60 of the transistor portion 70 has the emitter region 12 and the extraction region 15 exposed to the front surface 21 of the substrate 10. However, in the transistor portion 70, the emitter region 12 is not provided in the mesa portion 60 adjacent to the diode portion 80, and the extraction region 15 is provided.

In the semiconductor device 1100, the cathode region 82 is provided adjacent to the transistor portion 70. Therefore, in the semiconductor device 1100, the distance between the cathode region 82 of the diode portion 80 and the base region 14 and the extraction region 15 of the transistor portion 70 is shorter than that in the semiconductor device 100.

Therefore, at the time of conduction of the diode portion 80, the electron current diffused from the cathode region 82 flows into the base region 14 and the extraction region 15 of the transistor portion 70 to promote hole injection.

Further, in the transistor portion 70 of the semiconductor device 1100, the extraction region 15 having a higher doping concentration than the base region 14 is provided adjacent to the diode portion 80. Therefore, in the semiconductor device 1100, more holes are injected into the substrate 10 from the extraction region 15.

When the hole density increases, it takes time for the holes to disappear after the diode portion 80 is turned off. Therefore, in the semiconductor device 1100, the reverse recovery current becomes large as compared with the semiconductor device 100, and the reverse recovery loss and the turn-on loss become large.

On the other hand, in the semiconductor device 100, by providing the injection suppression region 90 not having the extraction region 15 on the diode portion 80 side, the distance between the cathode region 82 and the transistor portion 70 becomes long, so that hole injection is suppressed. As a result, the reverse recovery current can be reduced, and the reverse recovery loss and the turn-on loss can be reduced.

Further, the semiconductor device 1100 is common to the semiconductor device 100 in that the lifetime control region 85 is provided in the drift region 18. However, the semiconductor device 1100 is different from the semiconductor device 100 in that the injection suppression region 90 is not provided, and the lifetime control region 85 is provided over at least a part of the transistor portion 70 from the diode portion 80.

In order to form the lifetime control region 85, for example, in a case where helium or protons are irradiated from the front surface 21, the irradiated helium or protons pass through the gate trench portion 40 of the transistor portion 70 where the emitter region 12 is located. Therefore, the interface state of the trench oxide film changes, and the gate of the gate trench portion 40 is turned on at a lower voltage than that of the gate trench portion not irradiated, so that the threshold voltage of the transistor portion 70 decreases.

On the other hand, in a case where helium or protons are irradiated from the back surface 23, since the lifetime control region is provided below the trench, the helium or protons do not pass through the trench oxide film, and the interface state of the trench oxide film does not change. However, irradiation from the back surface 23 requires high energy because the distance to the depth of the lifetime control region 85 is long.

In order to control the position of the lifetime control region 85 in the X axis direction, there is a method for covering the entire wafer with a metal mask that can withstand high energy, but there is a problem that positional variation in the X axis direction is large.

Therefore, when the irradiation is performed from the front surface 21, the distance to the depth of the lifetime control region 85 is short, and the irradiation can be performed in a low energy state. Therefore, the position in the X axis direction can be controlled by forming with a resist mask or the like. However, the irradiation method from the front surface 21 has a problem that the interface state of the trench oxide film is affected, and the threshold voltage is lowered as described above.

On the other hand, in the semiconductor device 100, the lifetime control region 85 is not provided in the transistor portion 70. Therefore, there is no lifetime control region 85 in the emitter region 12 of the transistor portion 70, and the threshold voltage drop is eliminated. In addition, by providing the lifetime control region 85 in at least a part of the injection suppression region 90, hole injection from the extraction region 15 of the transistor portion 70 at the time of conduction of the diode portion 80 is suppressed without lowering the threshold voltage.

Figure 3A:
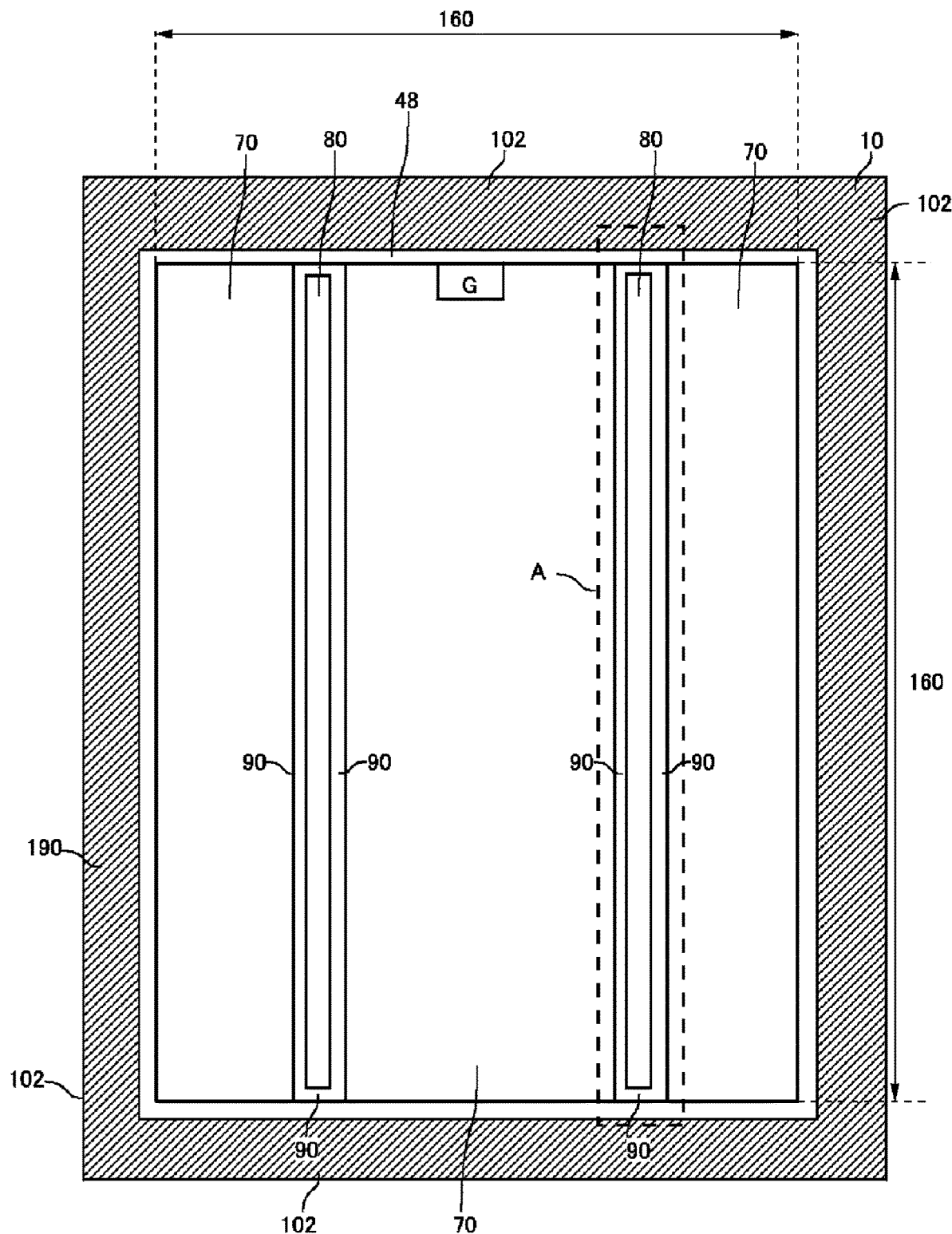
FIG. 3A is a top view of the semiconductor device 100 according to Example 1 of the present embodiment.

FIG. 3A is a top view of the semiconductor device 100 according to Example 1 of the present embodiment. FIG. 3A illustrates a position where each member is projected on the front surface of the semiconductor substrate 10. In FIG. 3A, only some members of the semiconductor device 100 are illustrated, and some members are omitted.

The substrate 10 of the semiconductor device 100 has two sets of end sides 102 facing each other in a top view. In FIG. 3A, the X axis and the Y axis are parallel to one of the end sides 102.

The substrate 10 is provided with an active region 160. The active region 160 is a region where a main current flows in the depth direction from the emitter region 12 of the substrate 10 in a case where the semiconductor device 100 operates. A region surrounded by the gate runner 48 in a top view may be the active region 160. Although an emitter electrode is provided above the active region 160, the emitter electrode is omitted in FIG. 3A.

At least one of the transistor portion 70 and the diode portion 80 is provided in the active region 160. The transistor portion 70 and the diode portion 80 of the present example are alternately disposed along a predetermined arrangement direction (X axis direction in the present example) in the front surface of the substrate 10. In another example, only one of the transistor portion 70 and the diode portion 80 may be provided in the active region 160.

The semiconductor device 100 may have one or more pads above the substrate 10. As an example, the semiconductor device 100 illustrated in FIG. 3A has a gate pad G in the active region 160. When the semiconductor device 100 is mounted, the gate pad G may be connected to an external circuit via wiring such as a wire.

A gate potential is applied to the gate pad Gather gate pad G and the gate runner 48 are electrically connected, and the gate runner 48 surrounds the active region 160 and is electrically connected to the gate conductive portion of the gate trench portion 40 of the active region 160.

The gate runner 48 is disposed between the active region 160 and the edge termination structure portion 190 of the substrate 10 in a top view. The gate runner 48 may be formed of a metal containing aluminum as a main component, such as polysilicon and an aluminum-silicon alloy.

The semiconductor device 100 of the present example includes an edge termination structure portion 190 between the active region 160 and the end side 102. The edge termination structure portion 190 of the present example is disposed between the gate runner 48 and the end side 102. The edge termination structure portion 190 reduces electric field strength on the front surface side of the substrate 10.

The edge termination structure portion 190 may include a plurality of guard rings. The guard ring is a P-type region in contact with the front surface of the substrate 10. By providing the plurality of guard rings, the depletion layer on the upper surface side of the active region 160 can be extended outward, and the breakdown voltage of the semiconductor device 100 can be secured. The edge termination structure portion 190 may further include at least one of a field plate and a RESURF annularly provided to surround the gate runner 48.

Further, the semiconductor device 100 may include a temperature sense portion (not illustrated) that is a PN junction diode formed of polysilicon or the like, and a current detection portion (not illustrated) that operates similarly to the transistor portion provided in the active region 160.

Figure 3B:
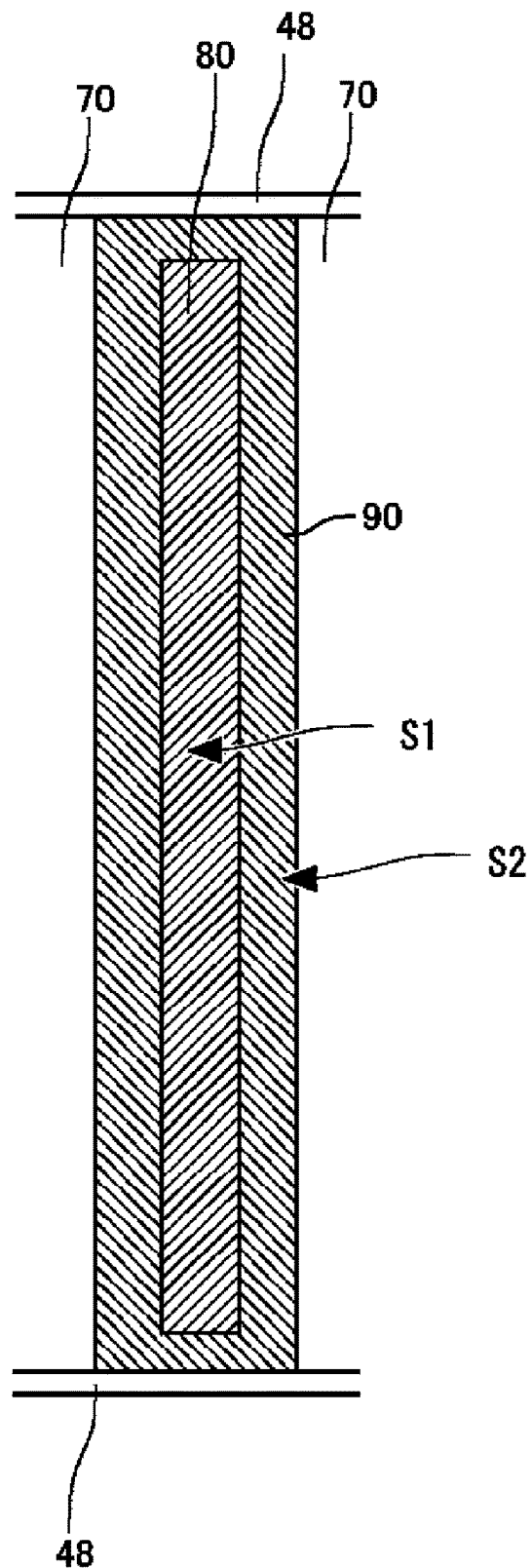
FIG. 3B is an enlarged view of a portion A of FIG. 3A.

FIG. 3B is an enlarged view of portion A in FIG. 3A. FIG. 3B illustrates an example in which one injection suppression region 90 is viewed from the upper side (the positive side on the Z axis in FIG. 3B) to the lower side (the negative side on the Z axis).

The injection suppression region 90 is also provided between the end portion in the extending direction (Y axis direction) of the diode portion 80 and the outer periphery (gate runner 48) of the active region 160. That is, in a top view, the diode portion 80 is surrounded by the injection suppression region 90 at both the end portion in the extending direction and the end portion in the arrangement direction (X axis direction).

In FIG. 3B, an area S1 of the diode portion 80 and an area S2 of the injection suppression region 90 satisfy the following Expression (2).

$$S1 \geq (S1+S2)/10 \qquad \text{[Expression (2)]}$$

By satisfying [Expression (2)], as the area S1 of the diode portion 80 is smaller, or the total area (S1+S2) of the diode portion 80 and the injection suppression region 90 is larger, hole injection from the transistor portion 70 is suppressed, and the reverse recovery and the turn-on loss are reduced. In addition, in a case where the area S1 of the diode portion 80 is reduced, the ON voltage and the thermal resistance of the package increase. Therefore, in a case where it is desired to lower the ON voltage while securing the injection suppression region 90, the area of the substrate 10 is increased only by S2.

On the other hand, also in a case where it is desired to increase the total area (S1+S2) of the diode portion 80 and the injection suppression region 90, the area of the substrate 10 is similarly enlarged only by S2. On the other hand, in a case where the influence of the inverter loss is small even if the ON voltage rises, or in a case where the thermal resistance of the package structure portion is favorable and the temperature rise of the diode portion 80 is favorable, the area S1 of the diode portion 80 may be reduced without increasing the area of the substrate 10. Therefore, the ratio of the area S1 of the diode portion 80 may be 10% or more of the total area (S1+S2) of the diode portion 80 and the injection suppression region 90.

In consideration of [Expression (2)], the total area of the diode portion 80 may range from 1.4% to 22% of the area of the semiconductor device 100 in a top view.

Figure 3C:
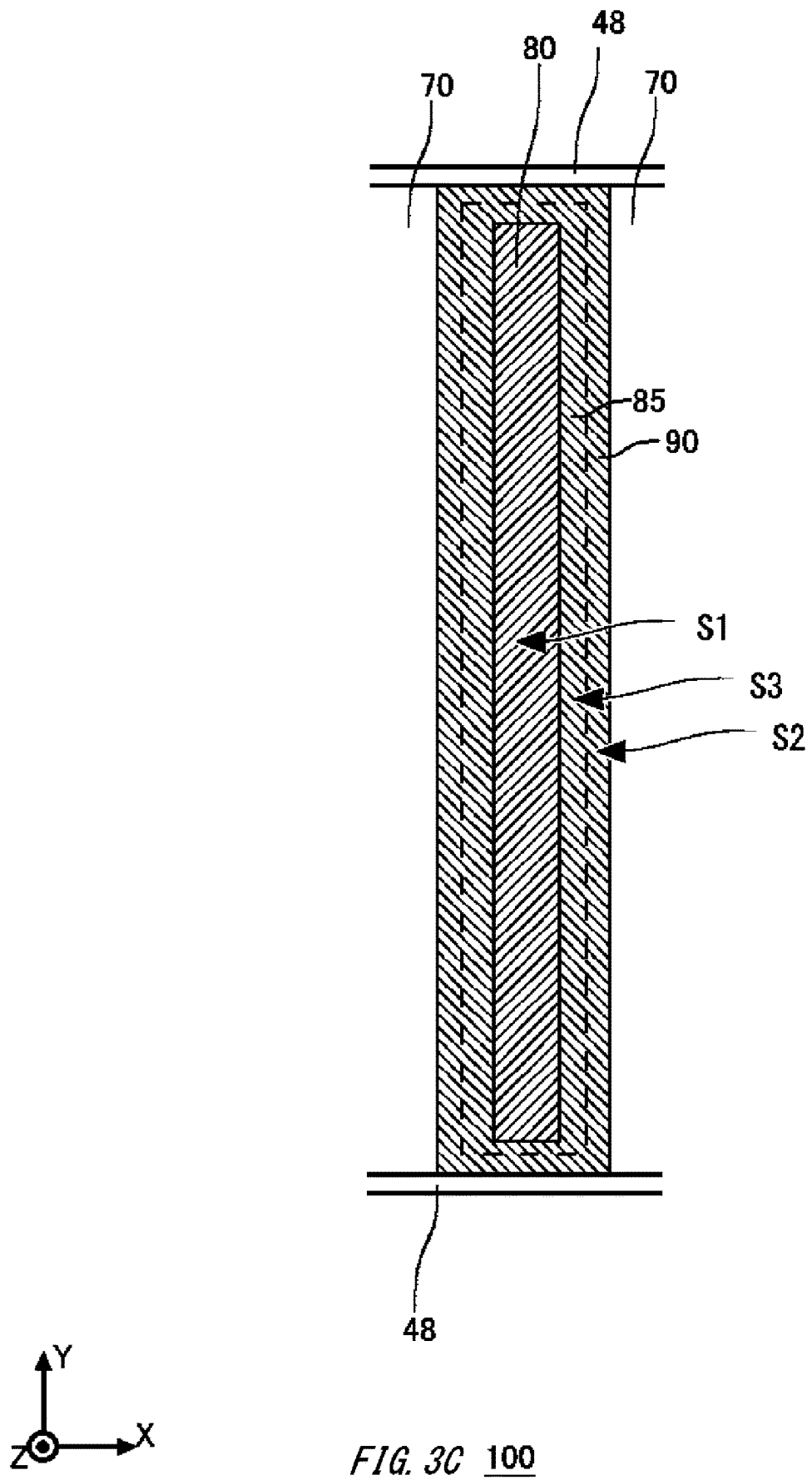
FIG. 3C is an enlarged view of the portion A of FIG. 3A.

FIG. 3C is an enlarged view of portion A in FIG. 3A. FIG. 3C illustrates an enlarged configuration of one diode portion 80 of the semiconductor device 100 and its periphery. In FIG. 3C, the lifetime control region 85 is indicated by a broken line. As illustrated in FIG. 3C, in a case where the lifetime control region 85 is provided over a part of the injection suppression region 90 from the diode portion 80, the area S1 of the diode portion 80, the area S2 of the injection suppression region 90, and the area S3 of the lifetime control region 85 satisfy the following Expression (3).

$$(S1+S2) > S3 \geq S1 \qquad \text{[Expression (3)]}$$

EXAMPLE 2

Figure 4:
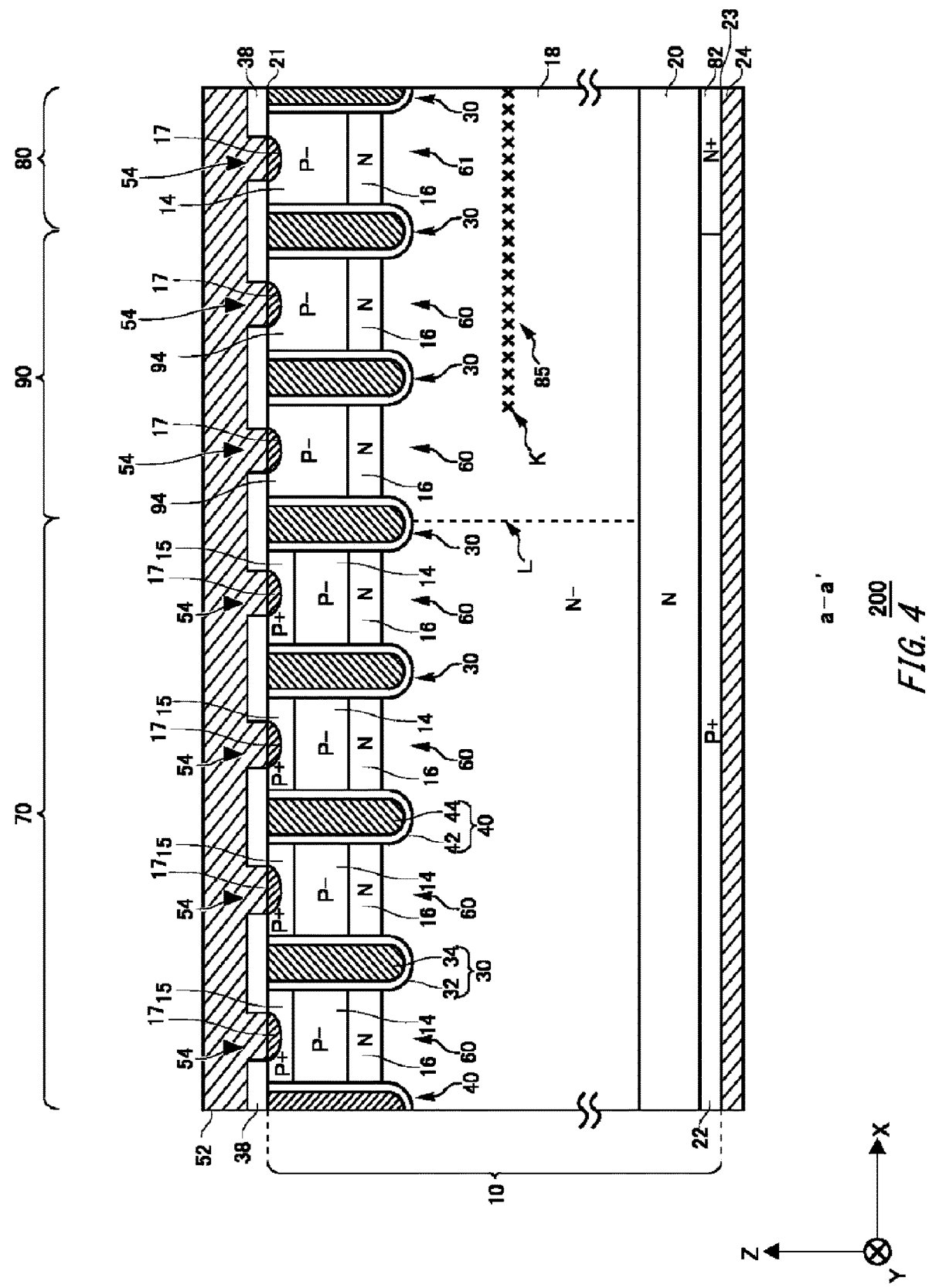
FIG. 4 is a partial sectional view of a semiconductor device 200 according to Example 2 of the present embodiment.

FIG. 4 is a partial sectional view of a semiconductor device 200 according to Example 2 of the present embodiment. Here, elements common to the semiconductor device 100 are denoted by the same reference numerals, and description thereof is omitted.

In the injection suppression region 90 of the semiconductor device 200, a base region 94 of the second conductivity type is provided instead of the base region 14. The doping concentration of the base region 94 may range from $1 \times e^{16}$ cm$^{-3}$ to $5 \times e^{19}$ cm$^{-3}$.

Note that the doping concentration of the base region 14 may range from $1 \times e^{16}$ cm$^{-3}$ to $1 \times e^{18}$ cm$^{-3}$, and the doping concentration of the extraction region 15 may range from $5 \times e^{18}$ cm$^{-3}$ to $5 \times e^{20}$ cm$^{-3}$.

By making the doping concentration of the base region 94 lower than that of the extraction region 15, the effect of suppressing hole injection from the transistor portion 70 can be enhanced. When the concentration of the base region 14 is lower than that of the base region 94, the effect of suppressing the hole injection can be further enhanced.

In addition, a processing method for dividing the doping concentrations of the base region 14 and the base region 94 is as follows. In a case where the doping concentration of the base region 94 is higher than that of the base region 14, both the base regions 14 and 94 are doped, and then the base region 14 is doped with a mask to space the base region 94. On the other hand, in a case where the doping concentration of the base region 94 is lower than that of the base region 14, the base region 14 and the base region 94 are processed by doping using different masks.

In addition, in a case where the doping concentrations of the base region 94 and the base region 14 are equal, processing can be performed using a similar mask. Therefore, it is not necessary to add a mask, and it is possible to improve the processing ability and reduce the cost of the chip by reducing the mask.

EXAMPLE 3

Figure 5A:
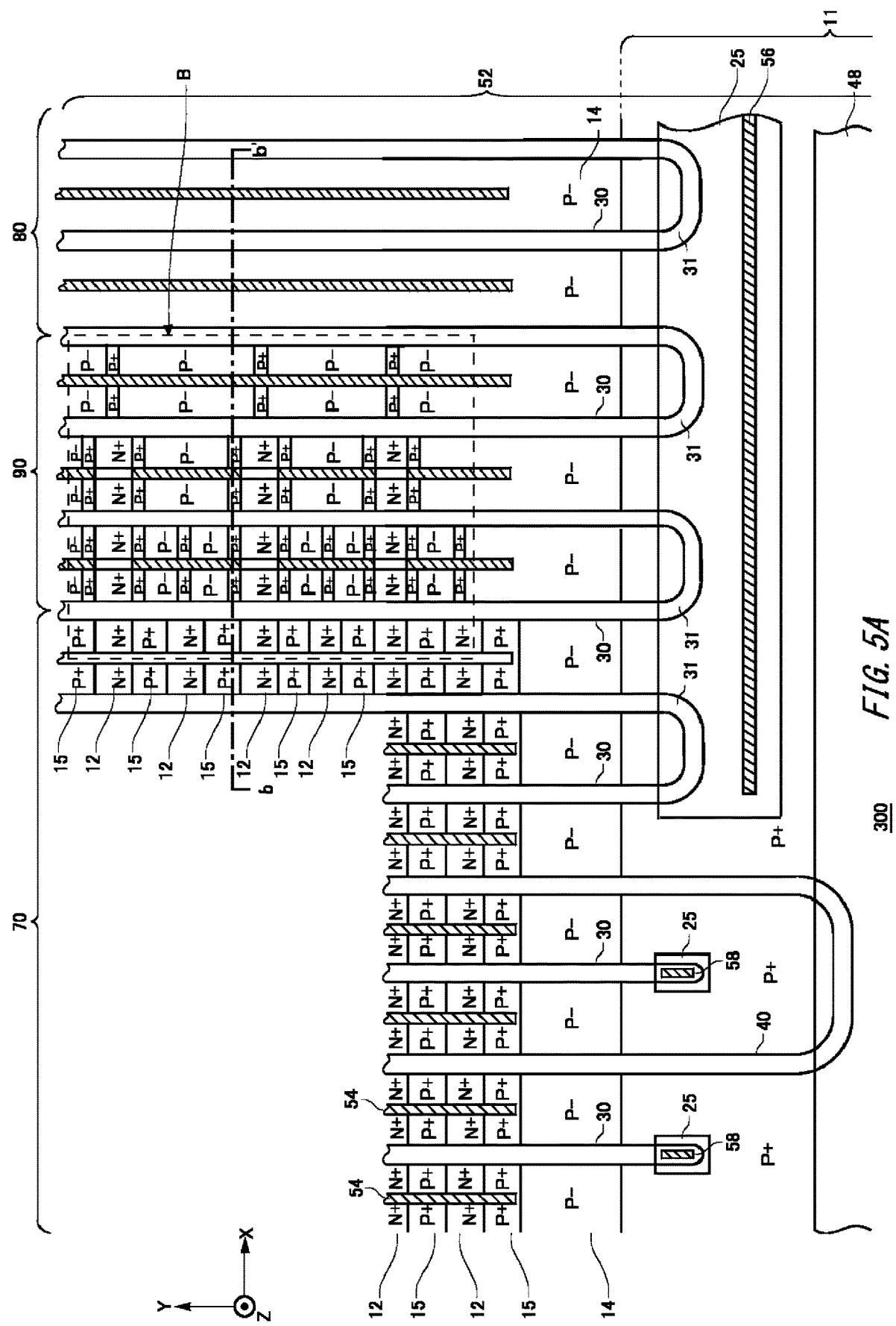
FIG. 5A is a partial top view of a semiconductor device 300 according to Example 3 of the present embodiment.

FIG. 5A is a partial top view of a semiconductor device 300 according to Example 3 of the present embodiment. Here, elements common to the semiconductor device 100 are denoted by the same reference numerals, and description thereof is omitted.

Similarly to the semiconductor devices 100 and 200, the injection suppression region 90 of the semiconductor device 300 includes the dummy trench portion 30 and does not include the gate trench portion 40. However, unlike the semiconductor devices 100 and 200, the injection suppression region 90 of the semiconductor device 300 includes the emitter region 12 and the extraction region 15 exposed to the front surface 21. However, the ratio of the emitter region 12 and the extraction region 15 in the injection suppression region 90 is lower than the ratio of the emitter region 12 and the extraction region 15 in the transistor portion 70.

As illustrated in FIG. 5A, in the injection suppression region 90, the emitter region 12 and the extraction region 15 are smaller than those of the transistor portion 70. In the injection suppression region 90, the base region 14 is provided in a portion where the emitter region 12 and the extraction region 15 are not provided.

That is, in the transistor portion 70, the emitter region 12 and the extraction region 15 are alternately disposed in the extending direction (Y axis direction in FIG. 5A), but in the injection suppression region 90, the extraction region 15 is disposed around the emitter region 12, and the base region 14 is provided around the extraction region 15.

In this way, in the semiconductor device 300, hole injection can be suppressed and the loss can be reduced by reducing the ratio of the extraction region 15 in the injection suppression region 90. In addition, since the injection suppression regions 90 of the semiconductor devices 100 and 200 do not have the emitter region 12, an electron current does not flow from the emitter region 12, but in the semiconductor device 300, since the injection suppression region 90 has the emitter region 12, an electron current flows. Therefore, the ON voltage can be reduced as compared with the semiconductor devices 100 and 200.

Figure 5B:
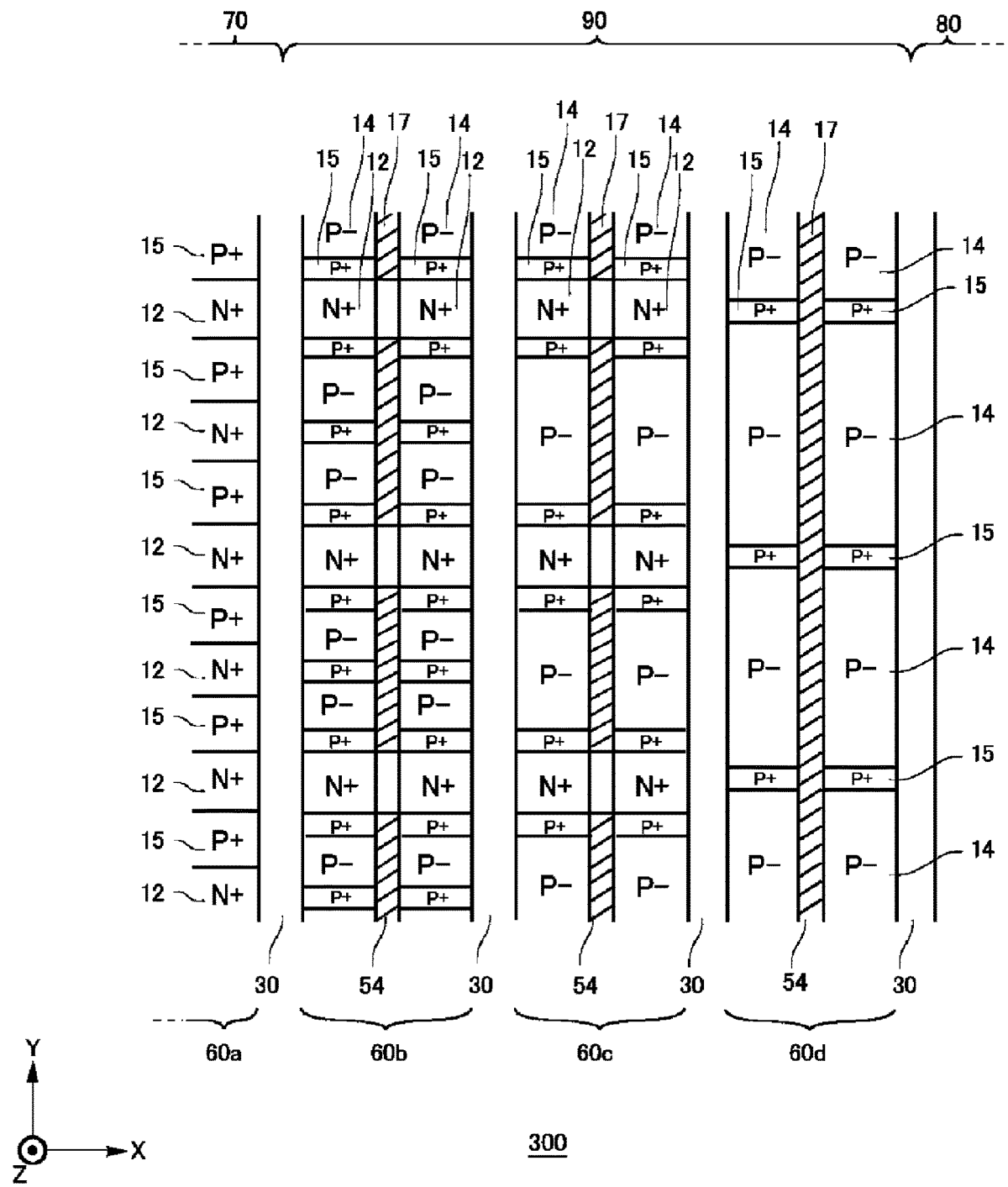
FIG. 5B is an enlarged view of a portion B in FIG. 5A.

FIG. 5B is an enlarged view of portion B in FIG. 5A. Here, the arrangement of the emitter region 12 and the extraction region 15 in the injection suppression region 90 will be mainly described.

In FIG. 5B, a mesa portion adjacent to the injection suppression region 90 in the mesa portion 60 of the transistor portion 70 is defined as a first mesa portion 60a, a mesa portion adjacent to the transistor portion 70 in the mesa portion 60 of the injection suppression region 90 is defined as a second mesa portion 60b, a mesa portion adjacent to the second mesa portion 60b is defined as a third mesa portion 60c, and a mesa portion adjacent to the diode portion 80 is defined as a fourth mesa portion 60d.

Although the injection suppression region 90 of the present example includes three mesa portions of the second mesa portion 60b to the fourth mesa portion 60d, the number of mesa portions is not limited thereto.

In the second mesa portion 60b to the fourth mesa portion 60d, either the emitter region 12 or the extraction region 15 is disposed so as to be adjacent to each of the emitter regions 12 disposed in the adjacent mesa portions on the negative side on the X axis.

In the first mesa portion 60a, six emitter regions 12 and six extraction regions 15 are alternately disposed in the Y axis direction. Out of the six emitter regions 12 of the first mesa portion 60a, every other three emitter regions 12 are respectively adjacent to the three emitter regions 12 disposed in the second mesa portion 60b, and the remaining three emitter regions 12 are respectively adjacent to the three extraction regions 15 disposed in the second mesa portion 60b.

The three emitter regions 12 of the second mesa portion 60b are adjacent to the three emitter regions 12 of the third mesa portion 60c, respectively. Alternatively, in the third mesa portion 60c, the extraction region 15 may be disposed instead of a part of the disposed three emitter regions 12.

In the second mesa portion 60b and the third mesa portion 60c, the emitter region 12 is adjacent to the extraction region 15 in the Y axis direction. That is, the emitter region 12 is surrounded by the extraction region 15 on the positive side and the negative side in the Y axis. As a result, holes generated by conductivity modulation can be extracted to the extraction region 15, so that latch-up withstand capability can be improved.

In the second mesa portion 60b and the third mesa portion 60c, the base region 14 is disposed in a region where the emitter region 12 and the extraction region 15 are not disposed.

The emitter region 12 is not disposed in the fourth mesa portion 60d. The extraction region 15 is disposed in the fourth mesa portion 60d, and is adjacent to the emitter region 12 of the adjacent mesa portion (the third mesa portion 60c in the present example) on the negative side on the X axis. In the fourth mesa portion 60d, the base region 14 is disposed in a region where the extraction region 15 is not disposed.

Alternatively, in a case where the emitter region 12 is not disposed in the mesa portion adjacent to the fourth mesa portion 60d on the negative side on the X axis, only the base region 14 is disposed in the fourth mesa portion 60d.

In FIG. 5B, the extraction region 15 of the injection suppression region 90 is disposed over the entire mesa portion in the X axis direction, but may be about half the length of the mesa portion in the X axis direction. In the injection suppression region 90, the length of the extraction region 15 in the X axis direction may be 0.3 µm or more.

In addition, in the injection suppression region 90, the length of the extraction region 15 in the Y axis direction is equal to or less than the length of the extraction region 15 of the transistor portion 70 in the Y axis direction. In the injection suppression region 90, the length of the extraction region 15 in the Y axis direction may be 0.5 µm or more. This makes it possible to improve the latch-up withstand capability while suppressing hole injection.

Note that the plug region 17 is disposed in the hatched portion of the contact hole 54 illustrated in FIG. 5B.

Figure 5C:
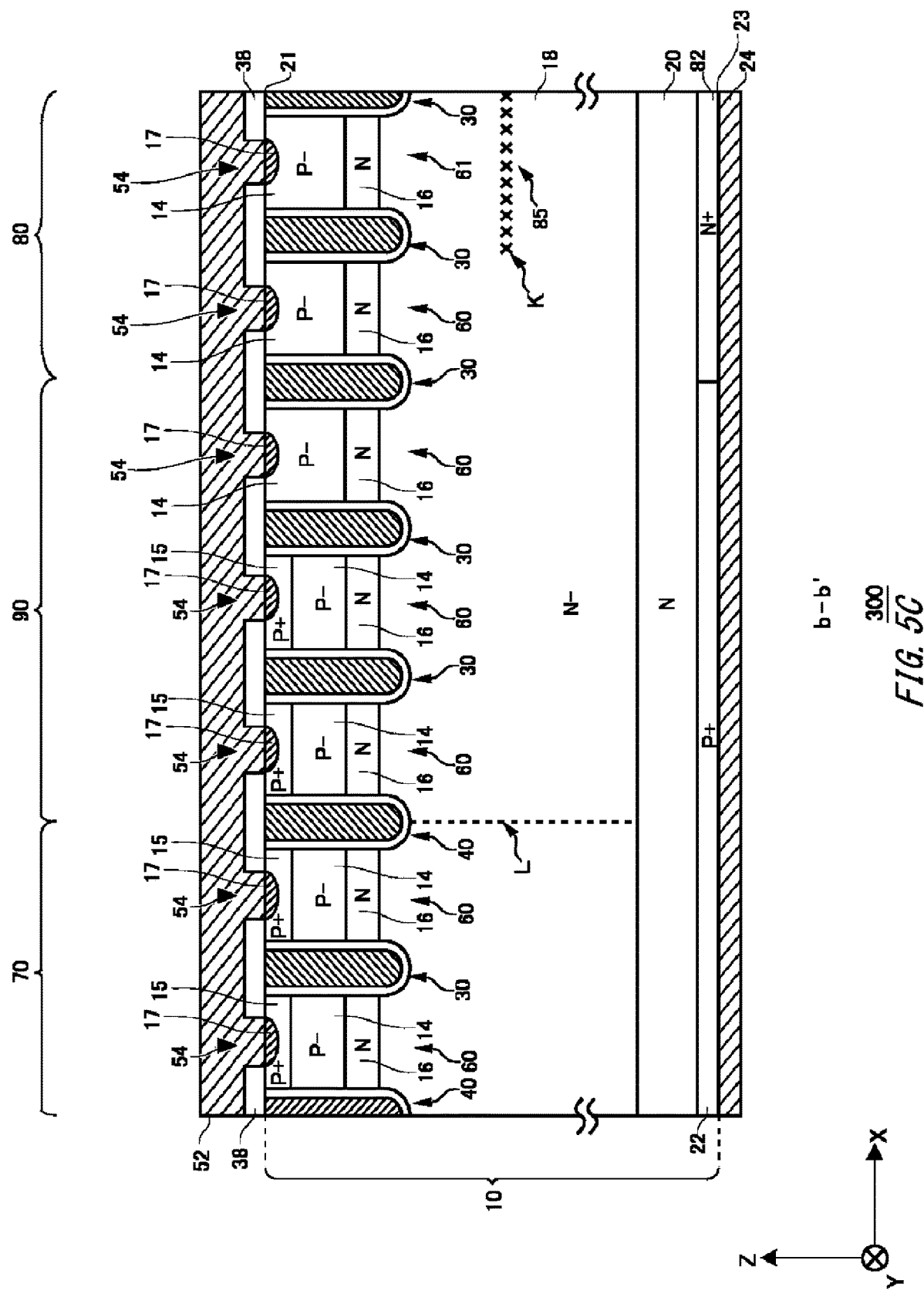
FIG. 5C is a diagram illustrating a cross section taken along line b-b' in FIG. 5A.

FIG. 5C is a diagram illustrating a cross section taken along line b-b' in FIG. 5A. The b-b' cross section is an XZ plane passing through the emitter region 12, the extraction region 15, and the base region 14 exposed to the front surface 21. The diode portion 80 of the semiconductor device 300 includes the lifetime control region 85 in the drift region 18.

The end portion K on the negative side on the X axis of the lifetime control region 85 is located at a position retracted to the positive side on the X axis by only a distance of 1 µm or more and 100 µm or less from the end portion of the diode portion 80 on the injection suppression region 90 side, that is, in the diode portion 80. That is, the lifetime control region 85 is not provided in the transistor portion 70 and the injection suppression region 90 of the present example.

In FIG. 5C, as illustrated in FIG. 5B, the extraction region 15 is provided in the injection suppression region 90. Therefore, by providing the lifetime control region 85 up to a position slightly retracted in the diode portion 80, recombination of holes and electrons generated from the base region 14 of the diode portion 80 is promoted at the time of conduction of the diode portion 80, thereby suppressing a hole current.

If the end portion K of the lifetime control region 85 extends to the injection suppression region 90, the threshold voltage decreases because the emitter region 12 is present in the injection suppression region 90 as described above. Therefore, unlike FIG. 1B, it is better not to provide the lifetime control region 85 in the injection suppression region 90.

The lifetime control region 85 is formed by, for example, irradiating protons or helium from the front surface 21 through a thick resist mask of 30 to 80 μm. Therefore, if the lifetime control region 85 is not slightly retracted into the diode portion 80, the lifetime control region 85 is formed in the injection suppression region 90 when the inclination angle of the thick resist mask varies, and the threshold voltage tends to decrease or vary.

Therefore, by providing the lifetime control region 85 up to a position slightly retracted in the diode portion 80, even if the inclination angle of the resist varies, the lifetime control region 85 is not formed in the injection suppression region 90, and it is possible to prevent a decrease or variation in the threshold voltage.

A hole current is generated from the extraction region 15 on the negative side on the X axis with respect to the end portion K, but the ratio of the extraction region 15 in the injection suppression region 90 is reduced as illustrated in FIG. 5B, so that hole injection can be reduced as compared with the case of providing the transistor portion 70. Therefore, in the present example, even if the lifetime control region 85 is not provided in the injection suppression region 90, the hole density can be reduced as compared with the case where the hole current is injected from the transistor portion 70.

Figure 5D:
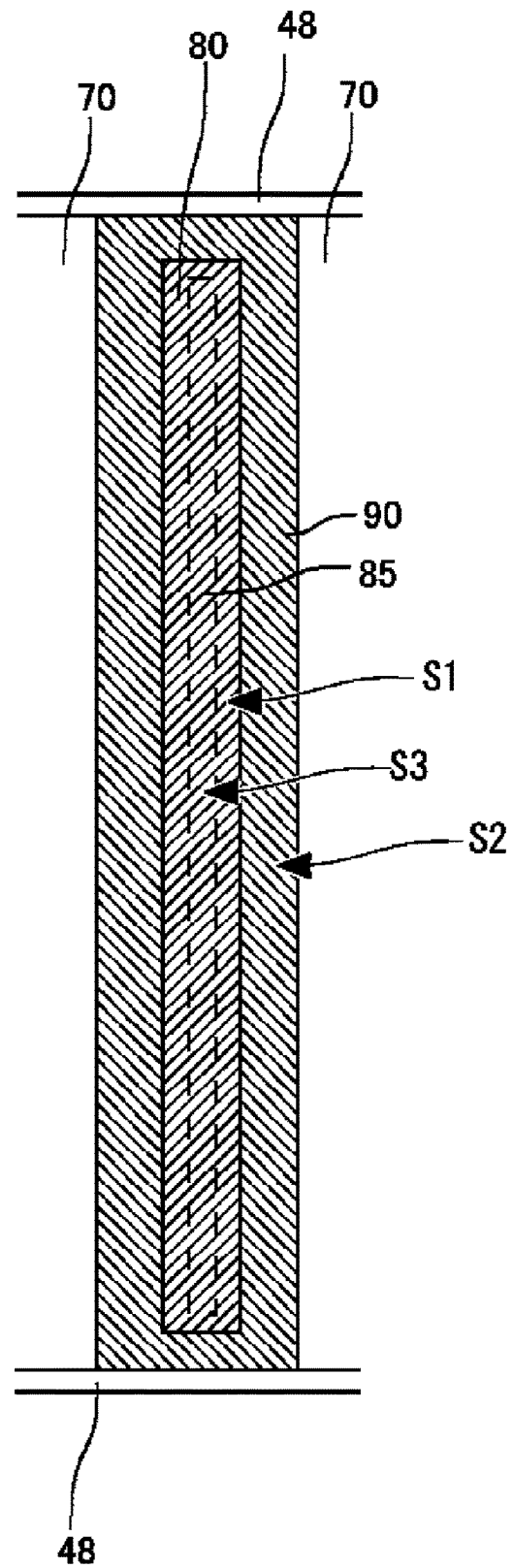
FIG. 5D is an enlarged partial top view of the semiconductor device 300.

FIG. 5D is an enlarged partial top view of the semiconductor device 300. The configuration of the semiconductor device 300 in a top view is the same as that of the semiconductor device 100 illustrated in FIG. 3A except for the configuration of the emitter region 12, the base region 14, and the extraction region 15 in the injection suppression region 90, and thus is not illustrated.

Similarly to the enlarged partial top view of the semiconductor device 100 illustrated in FIG. 3C, FIG. 5D illustrates one diode portion 80 of the semiconductor device 300 and a peripheral configuration thereof in an enlarged manner. In FIG. 5D, the lifetime control region 85 is indicated by a broken line.

As illustrated in FIG. 5D, in a case where the lifetime control region 85 is provided up to the position slightly retracted in the diode portion 80, the area S1 of the diode portion 80, the area S2 of the injection suppression region 90, and the area S3 of the lifetime control region 85 satisfy the following Expression (4).

$$(S1+S2) \geq S1 > S3 \qquad \text{[Expression (4)]}$$

EXAMPLE 4

Figure 6A:
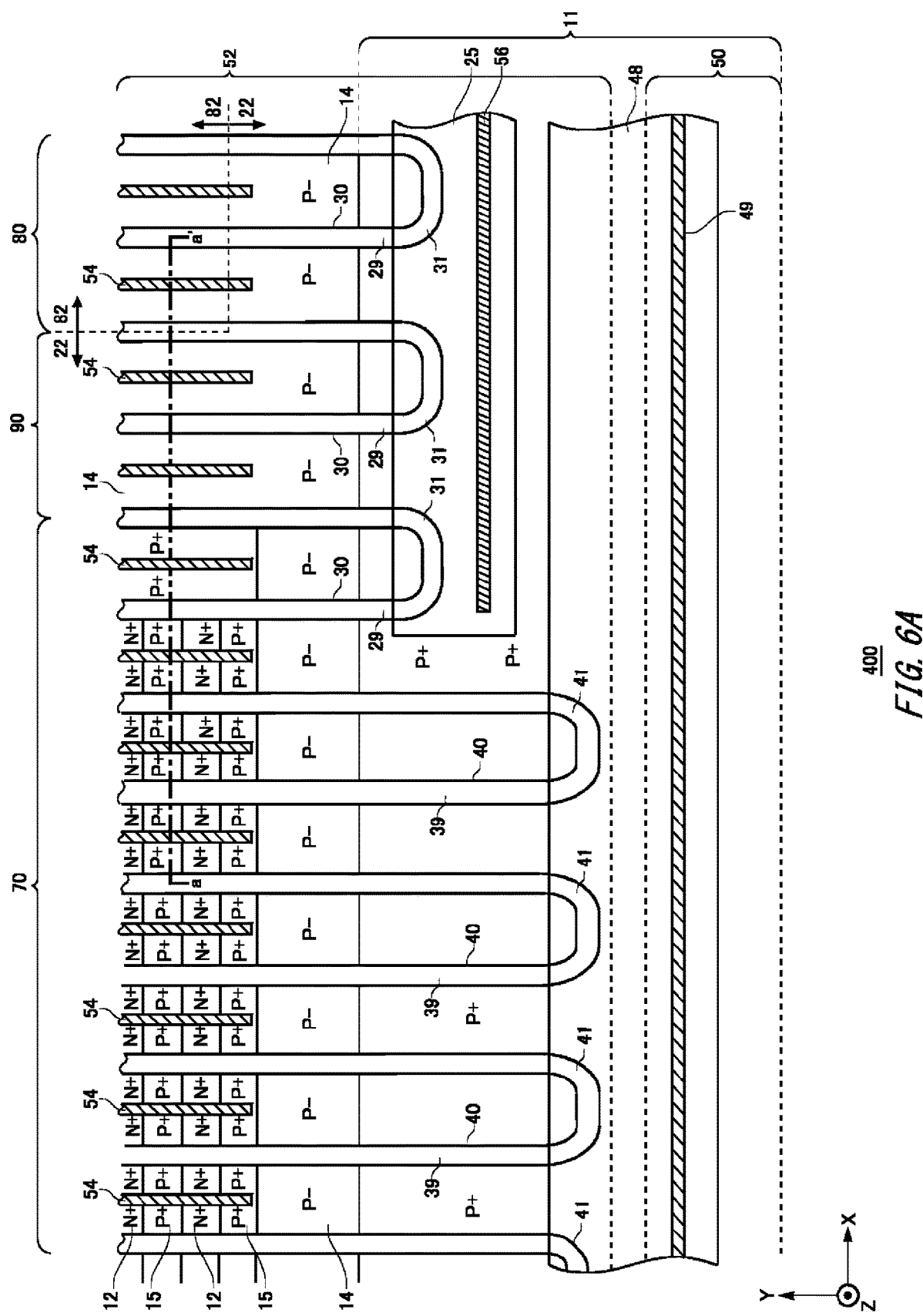
FIG. 6A is a partial top view of a semiconductor device 400 according to Example 4 of the present embodiment.
Figure 6B:
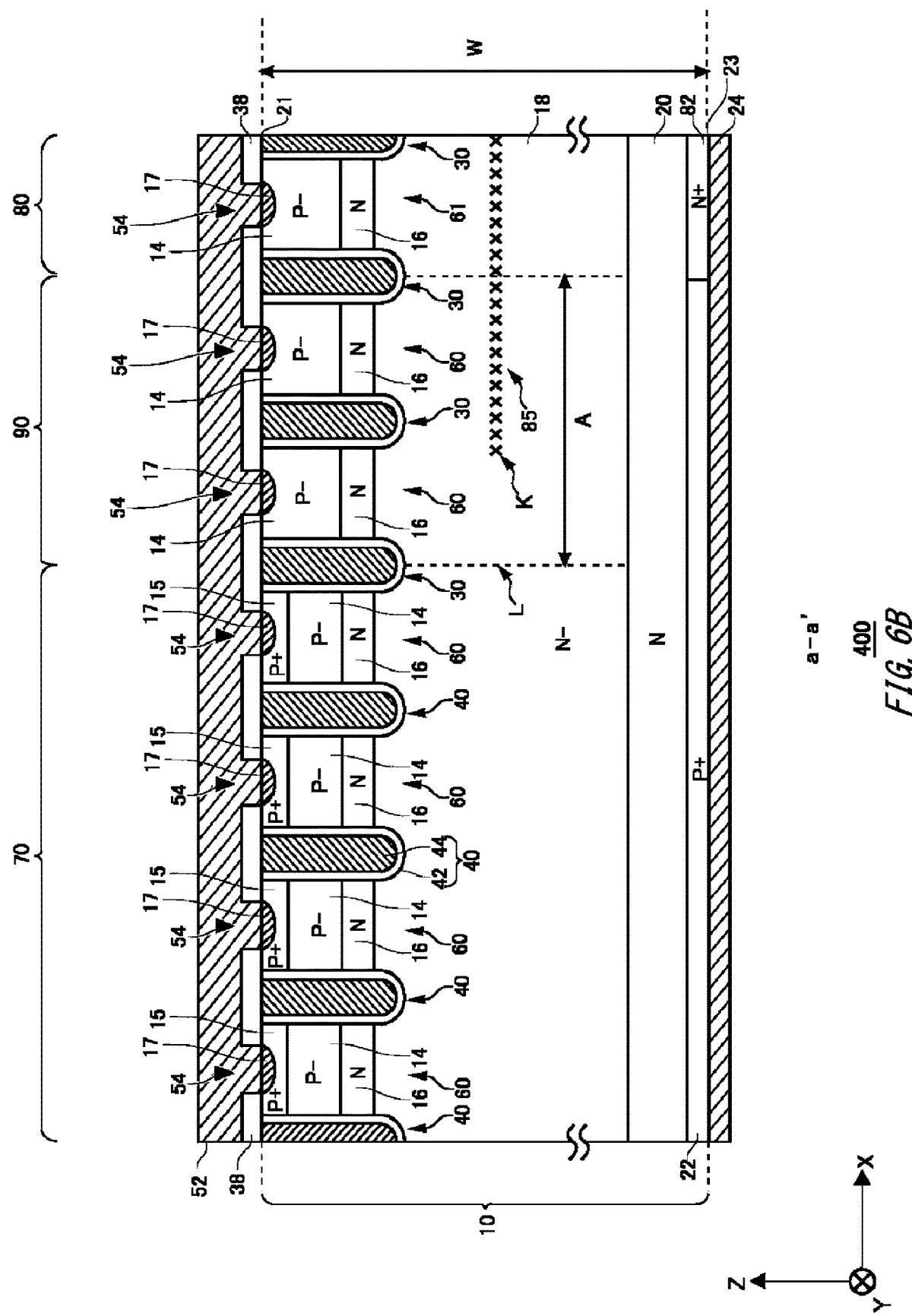
FIG. 6B is a diagram illustrating a cross section taken along line a-a' in FIG. 6A.

FIG. 6A is a partial top view of a semiconductor device 400 according to Example 4 of the present embodiment. FIG. 6B is a diagram illustrating a cross section taken along line a-a' in FIG. 6A. Here, elements common to the semiconductor device 100 are denoted by the same reference numerals, and description thereof is omitted.

In the present example, the transistor portion 70 is provided with a plurality of gate trench portions 40 along the arrangement direction, and the diode portion 80 is provided with a plurality of dummy trench portions 30 along the arrangement direction.

The transistor portion 70 of the present example has a full gate structure in which the dummy trench portion 30 is not provided. Each of the gate trench portions 40 is connected to the adjacent gate trench portion 40 via the edge portion 41.

In this way, by providing the injection suppression region 90, hole injection from the transistor portion 70 is suppressed, and the reverse recovery loss is improved. In this way, also in the semiconductor device 400 having the full gate structure, the same effect as that of the semiconductor devices 100 to 300 in which the dummy trench portion 30 is provided in the transistor portion 70 can be obtained.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: substrate11: well region12: emitter region14: base region15: extraction region16: accumulation region17: plug region18: drift region20: buffer region21: front surface22: collector region23: back surface24: collector electrode25: connection portion29: straight portion30: dummy trench portion31: edge portion32: dummy insulating film34: dummy conductive portion38: interlayer dielectric film39: straight portion40: gate trench portion41: edge portion42: gate insulating film44: gate conductive portion48: gate runner49: contact hole50: gate metal layer52: emitter electrode54: contact hole56: contact hole58: contact hole60: mesa portion60a: first mesa portion60b: second mesa portion60c: third mesa portion60d: fourth mesa portion61: mesa portion70: transistor portion80: diode portion82: cathode region85: lifetime control region90: injection suppression region94: base region100: semiconductor device102: end side160: active region190: edge termination structure portion200: semiconductor device300: semiconductor device400: semiconductor device1100: semiconductor device

What is claimed is:

1. A semiconductor device comprising:
   a semiconductor substrate including a transistor portion and a diode portion,
   wherein the transistor portion includes an injection suppression region configured to suppress injection of a carrier of a second conductivity type at an end portion on the diode portion side in a top view of the semiconductor substrate,
   wherein the diode portion includes a lifetime control region including a lifetime killer,
   wherein both the transistor portion and the diode portion have a base region of a second conductivity type in a surface of the semiconductor substrate,
   wherein the transistor portion further includes an emitter region of a first conductivity type and an extraction region of a second conductivity type having a higher doping concentration than the base region in the surface of the semiconductor substrate, wherein the injection suppression region is not provided with the emitter region and the extraction region,
wherein the lifetime control region is provided over at least a part of the injection suppression region from the diode portion.

2. The semiconductor device according to claim 1, wherein a width of the lifetime control region in an arrangement direction of the transistor portion and the diode portion ranges from 20 μm to 1500 μm in the injection suppression region in a top view of the semiconductor substrate.

3. The semiconductor device according to claim 1, wherein a width of the injection suppression region in an arrangement direction of the transistor portion and the diode portion ranges from 20 μm to 900 μm in a top view of the semiconductor substrate.

4. The semiconductor device according to claim 1, wherein the injection suppression region is further provided between an end portion of the diode portion in an extending direction and an outer periphery of an active region in a top view of the semiconductor substrate.

5. The semiconductor device according to claim 1, wherein an area of the diode portion is 10% or more of a total area of the diode portion and the injection suppression region in a top view of the semiconductor substrate.

6. The semiconductor device according to claim 1, wherein a total area of the diode portion ranges from 1.4% to 22% of an area of the semiconductor device in a top view of the semiconductor substrate.

7. The semiconductor device according to claim 1, wherein a doping concentration of the base region in the injection suppression region is equal to or less than a doping concentration of the base region of the diode portion.

8. The semiconductor device according to claim 7, wherein a doping concentration of the base region in the injection suppression region ranges from $1 \times e^{16}$ cm$^{-3}$ to $5 \times e^{19}$ cm$^{-3}$.

9. The semiconductor device according to claim 1, wherein a doping concentration of the base region of the diode portion ranges from $1 \times e^{16}$ cm$^{-3}$ to $1 \times e^{18}$ cm$^{-3}$.

10. The semiconductor device according to claim 9, wherein an end portion of the lifetime control region on the injection suppression region side is at a position retreated into the diode portion only by a distance of 1 μm or more and 10 μm or less from an end portion of the diode portion on the injection suppression region side.

11. The semiconductor device according to claim 1, wherein a doping concentration of the extraction region ranges from $5 \times e^{18}$ cm$^{-3}$ to $5 \times e^{20}$ cm$^{-3}$.

12. The semiconductor device according to claim 1, further comprising:
an accumulation region of a first conductivity type in the semiconductor substrate.

13. A semiconductor device comprising:
a semiconductor substrate including a transistor portion and a diode portion,
wherein the transistor portion includes an injection suppression region configured to suppress injection of a carrier of a second conductivity type at an end portion on the diode portion side in a top view of the semiconductor substrate,
wherein the diode portion includes a lifetime control region including a lifetime killer,
wherein both the transistor portion and the diode portion have a base region of a second conductivity type in a surface of the semiconductor substrate,
wherein the transistor portion and the injection suppression region further include an emitter region of a first conductivity type and an extraction region of a second conductivity type having a higher doping concentration than the base region in the surface of the semiconductor substrate,
wherein a ratio of the emitter region and the extraction region in the injection suppression region is lower than a ratio of the emitter region and the extraction region in the transistor portion,
wherein, between a plurality of trench portions which extend in an extending direction of the transistor portion and the diode portion and are arranged in an arrangement direction of the transistor portion and the diode portion, the transistor portion and the injection suppression region include a plurality of mesa portions extending in the extending direction, and
wherein any one of the emitter region and the extraction region is disposed in a mesa portion of the injection suppression region so as to be adjacent to each of the emitter regions disposed in a mesa portion adjacent to the transistor portion side.

14. The semiconductor device according to claim 13, wherein the emitter region of the injection suppression region is adjacent to the extraction region in the extending direction.

15. The semiconductor device according to claim 13, wherein a length of the extraction region is 0.5 μm or more in an extending direction of the transistor portion and the diode portion in a top view of the semiconductor substrate.

16. The semiconductor device according to claim 13, wherein a length of the extraction region is 0.3 μm or more in an arrangement direction of the transistor portion and the diode portion in a top view of the semiconductor substrate.

17. The semiconductor device according to claim 13, wherein the base region is disposed in a portion where the emitter region and the extraction region are not disposed in a top view of the semiconductor substrate in the injection suppression region.

18. A semiconductor device comprising:
a semiconductor substrate including a transistor portion and a diode portion,
wherein the transistor portion includes an injection suppression region configured to suppress injection of a carrier of a second conductivity type at an end portion on the diode portion side in a top view of the semiconductor substrate,
wherein the diode portion includes a lifetime control region including a lifetime killer,
wherein both the transistor portion and the diode portion have a base region of a second conductivity type in a surface of the semiconductor substrate,
wherein the transistor portion and the injection suppression region further include an emitter region of a first conductivity type and an extraction region of a second conductivity type having a higher doping concentration than the base region in the surface of the semiconductor substrate,
wherein a ratio of the emitter region and the extraction region in the injection suppression region is lower than a ratio of the emitter region and the extraction region in the transistor portion, and wherein the emitter region is not disposed in a mesa portion adjacent to the diode portion in the injection suppression region.

* * * * *